US010860765B1

(12) United States Patent
Li et al.

(10) Patent No.: US 10,860,765 B1
(45) Date of Patent: Dec. 8, 2020

(54) CLOCK TREE ROUTING IN PROGRAMMABLE LOGIC DEVICE

(71) Applicant: Xilinx, Inc., San Jose, CA (US)

(72) Inventors: Wuxi Li, Austin, TX (US); Mehrdad Eslami Dehkordi, Los Gatos, CA (US); Xiaojian Yang, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/283,552

(22) Filed: Feb. 22, 2019

(51) Int. Cl.
*G06F 17/50* (2006.01)
*G06F 30/34* (2020.01)
*H03K 19/17736* (2020.01)
*G06F 30/396* (2020.01)

(52) U.S. Cl.
CPC ......... *G06F 30/34* (2020.01); *H03K 19/1774* (2013.01); *G06F 30/396* (2020.01)

(58) Field of Classification Search
CPC .... G06F 30/34; G06F 30/396; H03K 19/1774
See application file for complete search history.

(56) References Cited

U.S. PATENT DOCUMENTS

| | | | | |
|---|---|---|---|---|
| 8,225,262 | B1* | 7/2012 | Tom | G06F 30/34 |
| | | | | 716/122 |
| 10,068,048 | B1* | 9/2018 | Eslami Dehkordi | |
| | | | | G06F 30/398 |
| 10,216,880 | B1* | 2/2019 | Liu | G06F 30/30 |
| 2008/0276209 | A1* | 11/2008 | Albrecht | G06F 30/3312 |
| | | | | 716/113 |

OTHER PUBLICATIONS

Ravindra K. Ahuja, Thomas L. Magnanti, and James B. Orlin. 1993. Network Flows: Theory, Algorithms, and Applications. Prentice-Hall, Inc.
Vaughn Betz and Jonathan Rose, 1997, VPR: A new packing, placement and routing tool for FPGA research. In FPL. 213-222.
Yu-Chen Chen, Sheng-Yen Chen, and Yao-Wen Chang. 2014. Efficient and effective packing and analytical placement for large-scale heterogeneous FPGAs. In ICCAD. 647-654.
Marshall L Fisher. 1981. The Lagrangian relaxation method for solving integer programming problems. Management science 27, 1 (1981), 1-18.
Marcel Gort and Jason H. Anderson. 2012. Analytical placement for heterogeneous FPGAs. In FPL. 143-150.

(Continued)

*Primary Examiner* — Nghia M Doan
(74) *Attorney, Agent, or Firm* — Patterson + Sheridan, LLP

(57) ABSTRACT

Some examples described herein provide for clock tree generation for a programmable logic device, and more specifically, for clock tree generation in conjunction or simultaneous with placement of logic for a programmable logic device. In an example, a design system includes a processor and a memory coupled to the processor. The memory stores instruction code. The processor is configured to execute the instruction code to: generate clock trees in conjunction with placing logic for an application to be implemented in a programmable logic region of a programmable logic device; generate data routes between the placed logic; and generate a physical implementation of the application based on the placed logic, the clock trees, and the data routes. The physical implementation is capable of being loaded on the programmable logic region of the programmable logic device.

20 Claims, 11 Drawing Sheets

(56) References Cited

OTHER PUBLICATIONS

Peter E Hart, Nils J Nilsson, and Bertram Raphael. 1968. A formal basis for the heuristic determination of minimum cost paths. IEEE transactions on Systems Science and Cybernetics 4, 2(1968), 100-107.

Myung-Chul Kim, Dong-Jin Lee, and Igor L. Markov. 2012. SimPL: An Effective Placement Algorithm. IEEE TCAD 31, 1 (2012), 50-60.

Yun-Chih Kuo, Chau-Chin Huang, Shih-Chun Chen, Chun-Han Chiang. Yao-Wen Chang, and Sy-Yen Kuo. 2017. Clock-Aware Placement for Large-Scale Heterogeneous FPGAs. In ICCAD. 519-526.

Julien Lamoureux and Steven J. E. Wilton. 2008. On the Trade-off Between Power and Flexibility of FPGA Clock Networks. ACM Transactions on Reconfigurable Technology and Systems (TRETS) 1, 3 (2008), 13:1-13:33.

Eugene L Lawler and David E Wood. 1966. Branch-and-bound methods: A survey. Operations research 14, 4 (1966), 699-719.

Wuxi Li, Shounak Dhar, and David Z. Pan. 2017, UTPlaceF: A routability-driven FPGA placer with physical and congestion aware packing. IEEE TCAD (2017).

Wuxi Li, Yibo Lin, Meng Li, Shounak Dhar, and David Z Pan. 2018. UTPlaceF 2.0: A High-Performance Clock-Aware FPGA Placement Engine. ACM TODAES 23, 4 (2018), 42.

Wuxi Li and David Z. Pan. 2018. A New Paradigm for FPGA Placement without Explicit Packing. IEEE TCAD (2018).

Tzu-Hen Lin, Pritha Banerjee, and Yao-Wen Chang. 2013. An efficient and effective analytical placer for FPGAs. In DAC 10:1-10.6.

Wen-Hao Liu, Yih-Lang Li, and Cheng-Kok Koh. 2012. A fast maze-free routing congestion estimator with hybrid unilateral monotonic routing. In ICCAD. 713-719.

Alexander S. Marquardt, Vaughn Betz, and Jonathan Rose. 1999. Using cluster-based logic blocks and timing-driven packing to improve FPGA speed and density. In FPGA. 37-46.

Ryan Pattison, Ziad Abuowaimer, Shawki Areibi, Gary Grewal, and Anthony Vannelli. 2016. GPlace: A congestion-aware placement tool for ultrascale FPGAs. In ICCAD. 68:1-68:7.

Chak-Wa Pui, Gengjie Chen, Wing-Kai Chow, Ka-Chun Lam, Jian Kuang, Peishan Tu, Hang Zhang, Evangeline FY. Young, and Bei Yu. 2016. RippleFPGA: A routability-driven placement for large-scale heterogeneous FPGAs. In ICCAD. 67:1-67.8.

Chak-Wa Pui, Gengjie Chen, Yuzhe Ma, Evangeline F. Y. Young, and Bei Yu. 2017. Clock-Aware UltraScale FPGA Placement with Machine Learning Routability Prediction. In ICCAD. 915-922.

Senthilkumar Thora vi Rajavel and Ali Akoglu. 2011. MO-Pack: Many-objective clustering for FPGA CAD. In DAC. 818-823.

Amit Singh, Ganapathy Parthasarathy, and Malgorzata Marek-Sadowska. 2002. Efficient circuit clustering for area and power reduction in FPGAs. ACM TODAES 7, 4 (2002), 643-663.

Love Singhal, Mahesh A. Iyer, and Saurabh Adya. 2017. LSC: A Large-Scale Consensus-Based Clustering Algorithm for High-Performance FPGAs. In DAC. 30:1-30:6.

Marvin Tom, David Leong, and Guy Lemieux. 2006. Un/DoPack: re-clustering of large system-on-chip designs with interconnect variation for low-cost FPGAs. In ICCAD. 680-687.

Xilinx Inc. 2018. <http://www.xilinx.com.>.

Xilinx UltraScale Architecture Clocking Resources User Guide. 2018. https://www.xilinx.com/support/documentation/user_guides/ug572-ultrascale-clocking.pdf.

Xilinx Vivado Design Suite. 2018. https://www.xilinx.com/products/design-tools/ <http://https://www.xilinx.com/products/design-tools/>vivado.html.

M Xu, Gary Grewal, and Shawki Areibi. 2011. StarPlace: A new analytic method for FPGA placement. Integration, the VLSI Journal 44, 3 (2011), 192-204.

Stephen Yang, Aman Gayasen, Chandra Mulpuri, Sainath Reddy, and Rajat Aggarwal. 2016. Routability-Driven FPGA Placement Contest. In ISPD. 139-143.

Stephen Yang, Chandra Mulpuri, Sainath Reddy, Meghraj Kalase. Srinivasan Dasasathyan, Mehrdad E. Dehkordi, Marvin Tom, and Rajat Aggarwal. 2017. Clock-Aware FPGA Placement Contest. In ISPD. 159-164.

\* cited by examiner

CLOCK TREE ROUTING IN PROGRAMMABLE LOGIC DEVICE

TECHNICAL FIELD

Examples of the present disclosure generally relate to a programmable logic device, and in particular, relate to routing clock trees in the programmable logic device.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

Circuit designs could be created by generating circuits using primitives and/or writing hardware description language (HDL) code. Configuration data is then generated from the primitives and/or HDL, including placing logic and routing between the placed logic.

SUMMARY

Some examples described herein provide for clock tree generation for a programmable logic device, and more specifically, for clock tree generation in conjunction or simultaneous with placement of logic for a programmable logic device. Methods can achieve significantly improved wirelength routing with comparable or improved runtime in generating the placement and clock trees.

An example of the present disclosure is a design system. The design system includes a processor and a memory coupled to the processor. The memory stores instruction code. The processor is configured to execute the instruction code to: generate clock trees in conjunction with placing logic for an application to be implemented in a programmable logic region of a programmable logic device; generate data routes between the placed logic; and generate a physical implementation of the application based on the placed logic, the clock trees, and the data routes. The physical implementation is capable of being loaded on the programmable logic region of the programmable logic device.

Another example of the present disclosure is a design system. The design system includes a processor and a memory coupled to the processor. The memory stores instruction code. The processor is configured to execute the instruction code to: generate a clock routing solution for clock trees for clock nets of an application to be implemented in a programmable logic region of a programmable logic device. The processor being configured to execute the instruction code to generate the clock routing solution is further configured to: (i) create clock tree candidates for a cell-to-clock region assignment; (ii) iteratively until a current iteration set of selection variables has no overflow, a current iteration set of Lagrangian variables equals a next iteration set of Lagrangian variables, or a first predetermined number of iterations has been performed: (a) for each of the clock nets, identify one of the clock tree candidates having a minimum sum of a corresponding topology cost and a corresponding Lagrangian variable of the current iteration set of Lagrangian variables, for each identified one of the clock tree candidates, an indication being set for one selection variable of the current iteration set of selection variables corresponding to the respective identified one of the clock tree candidates; and (b) update the next iteration set of Lagrangian variables based on the current iteration set of Lagrangian variables and the current iteration set of selection variables; and (iii) assign the clock tree candidates corresponding to the respective indications of selection variables of a set of selection variables having a minimum overflow to the clock routing solution.

A further example of the present disclosure is a design system. The design system includes a processor and a memory coupled to the processor. The memory stores instruction code. The processor is configured to execute the instruction code to: generate clock trees for an application to be implemented in a programmable logic region of a programmable logic device, and generate a physical implementation of the application based on placed logic and the clock trees. The physical implementation is capable of being loaded on the programmable logic region of the programmable logic device. The processor being configured to execute the instruction code to generate the clock trees is further configured to: (i) initialize a set of constraints; (ii) push the set of constraints to a stack; (iii) iteratively while the stack is not empty and until a first predefined number of iterations is performed: (a) pop a popped set of constraints from the stack; (b) obtain a cell-to-clock region assignment based on the popped set of constraints; (c) obtain a cost of the cell-to-clock region assignment; and (d) if the cell-to-clock region assignment is feasible: (1) obtain a clock routing solution corresponding to the cell-to-clock region assignment; (2) if the clock routing solution does not have overflow and the cost is less than a current best cost, assign the cost to the current best cost, the cell-to-clock region assignment to a current best cell-to-clock region assignment, and the clock routing solution to a current best clock routing solution; and (3) if the clock routing solution has overflow: (I) derive a superset of derived sets of constraints from the popped set of constraints; (II) prune one or more of the derived sets of constraints from the superset of derived sets of constraints based on respective lower-bound costs of the one or more of the derived sets of constraints; and (III) push remaining one or more derived sets of constraints of the superset to the stack based on the respective lower-bound costs of the remaining one or more derived sets of constraints; and (iv) assign the current best clock routing solution to the clock trees.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
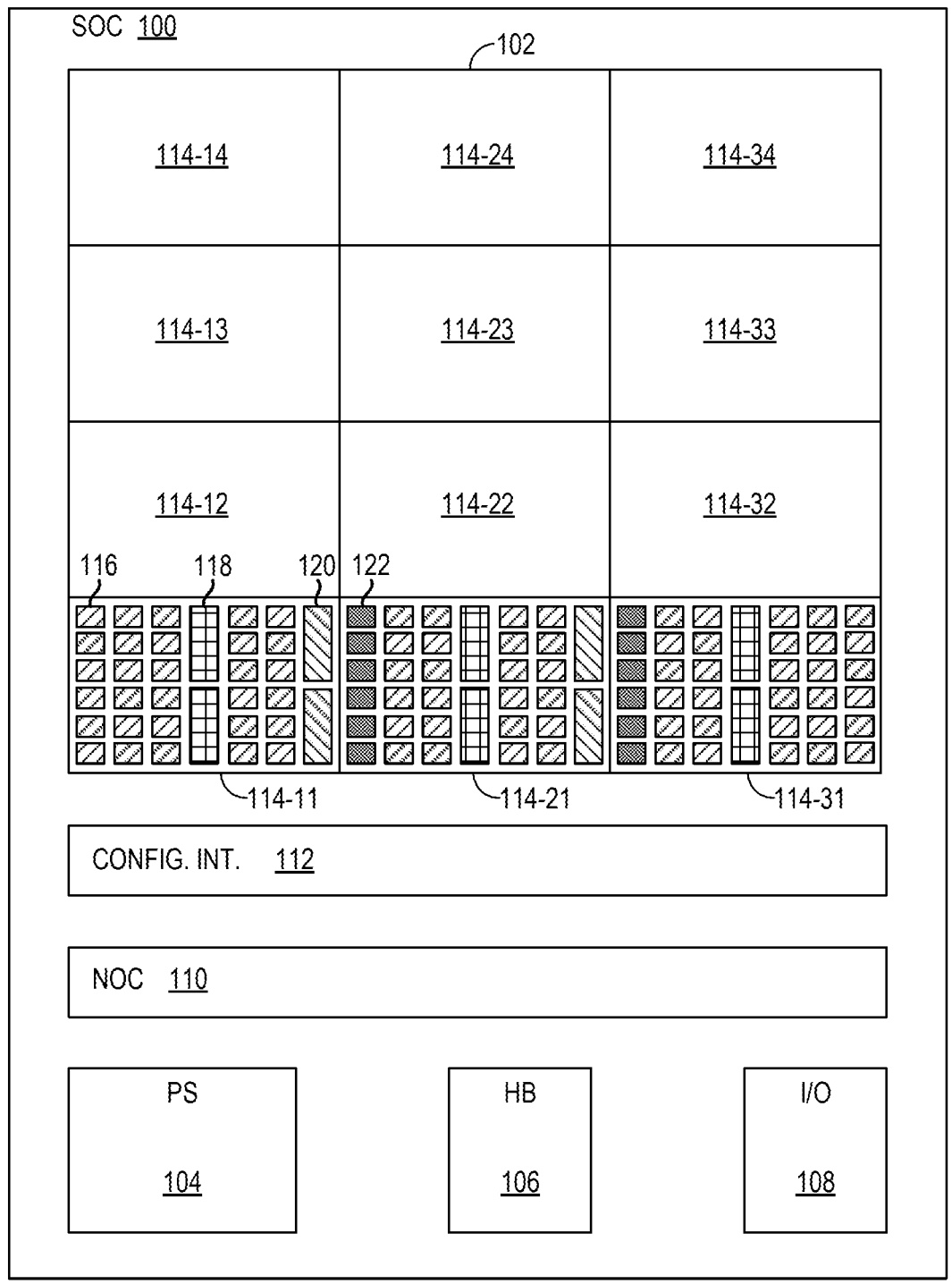
FIG. 1 is a block diagram depicting a system-on-chip (SoC) according to some examples.

Some examples described herein provide for clock tree generation for a programmable logic device. More specifically, some examples provide for clock tree generation in conjunction or simultaneous with placement of logic for a programmable logic device. Methods described herein can simultaneously optimize placement quality of logic and obtain clock routing feasibility by explicit clock tree generation. Methods can achieve significantly improved wirelength routing with comparable or improved runtime in generating the placement and clock trees.

Techniques and processor-based systems for routing clock trees between placed logic in programmable logic of programmable logic devices (e.g., fabric of a field programmable gate array (FPGA)) have been implemented previously. However, these techniques and processor-based systems have proven to be problematic, such as for complex designs, by failing to obtain a legal logic placement and clock routing solution or by taking exceedingly long runtimes to obtain such a solution. Accordingly, a technical problem existed in that no processor-based system was available to place logic and route clock trees within a programmable logic device (such as fabric of an FPGA) to obtain a legal solution with satisfactory runtime. Some examples provide a solution to this problem by implementing logic placement and clock tree generation simultaneously or in conjunction with each other. Hence, a legal solution for logic placement and clock tree generation can be obtained with reduced runtimes.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., vertical and horizontal; a column and a row; left and right; top and bottom; and north, south, east, and west. These designations are for ease of description of directions or orientations, and other directions or orientations may be implemented. Various aspects described below may be described as being optimal or optimized. Such description does not connote that what is described as being optimal or optimized is necessarily the most optimal or most optimized. Such description may connote that what is described may merely be the best of a given group given some circumstances, or improved relative to something else given some circumstances.

FIG. 1 is a block diagram depicting a system-on-chip (SoC) 100 according to some examples. The SoC 100 is an integrated circuit (IC) that is a programmable logic device, such as an FPGA. The SoC 100 comprises subsystems including a programmable logic region 102, a processing system 104, hard block circuits 106, input/output circuits 108, and a network-on-chip (NoC) 110. The SoC 100 also includes a configuration interconnect 112. Other circuits can be included in the SoC 100, such as other IP blocks like a system monitor or others.

The programmable logic region 102 is logic circuitry that may be programmed to perform specified functions. As an example, the programmable logic region 102 may be implemented as fabric of an FPGA. One programmable logic region is illustrated in FIG. 1, and other examples can include more programmable logic regions.

The programmable logic region 102 includes clock regions 114-11 to 114-34 (collectively or individually, clock region(s) 114). In the example of FIG. 1, programmable logic region 102 is formed of a two-dimensional array of clock regions 114. FIG. 1 illustrates, for simplicity, the clock regions 114 arranged in three aligned columns and four aligned rows, although other numbers of columns and/or rows may be implemented. The reference numerals of the clock regions 114 in FIG. 1 indicate the positioning of each clock region 114 by the reference number "114-[column][row]."

Figure 2:
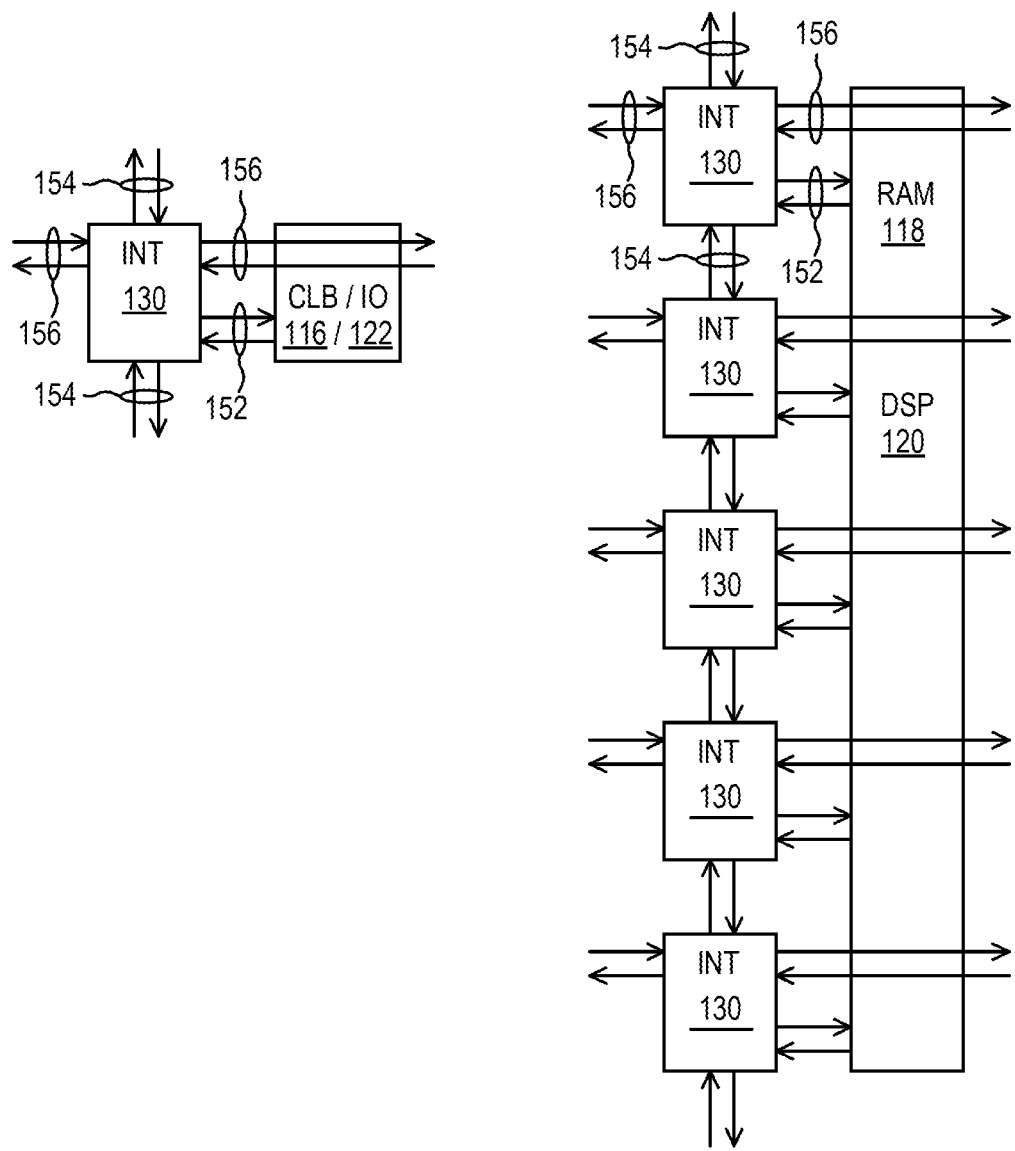
FIG. 2 is a block diagram depicting programmable interconnect elements and programmable logic elements of a programmable logic region of the SoC according to some examples.

The programmable logic region 102 can include programmable logic elements including configurable logic blocks (CLBs) 116, random access memories (RAMs) 118 (e.g., RAM blocks (BRAMs) and/or UltraScale RAMs (URAMS)), digital signal processing blocks (DSPs) 120, and input/output blocks (IOBs) 122. The CLBs 116 can further include lookup tables (LUTs) and flip-flops (FFs). Although not illustrated the programmable logic region 102 can include other programmable logic elements, such as clock managers and/or delay lock loops (DLLs). In the illustrated architecture, the programmable logic region 102 includes columns of programmable logic elements, where each column includes a single type of programmable logic element (e.g., a column of CLBs 116, a column of RAMs 118, etc.). As shown in FIG. 2, the programmable logic elements can have one or more associated programmable interconnect elements 130. For example, in some architectures, the programmable logic region 102 includes a column of programmable interconnect elements 130 associated with and neighboring each column of programmable logic elements. In such examples, each programmable interconnect element 130 is connected to an associated programmable logic element in a neighboring column by interconnections 152 and is connected to neighboring programmable interconnect elements within the same column by interconnections 154 and is connected to the neighboring columns by interconnections 156. The interconnected programmable interconnect elements 130 can form a global data routing network within the programmable logic region 102.

In FIG. 1, as an example, clock region 114-11 includes five columns of CLBs 116, one column of RAMs 118, and one column of DSPs 120. This pattern of the clock region 114-11 can be replicated as the clock regions 114-12, 114-13, 114-14 to extend the columns of various programmable logic elements through the programmable logic region 102. Clock region 114-21 includes one column of IOBs 122, four columns of CLBs 116, one column of RAMs 118, and one column of DSPs 120. This pattern of the clock region 114-21 can be replicated as the clock regions 114-22, 114-23, 114-24 to extend the columns of various programmable logic elements through the programmable logic region 102. Clock region 114-31 includes one column of IOBs 122, five columns of CLBs 116, and one column of RAMs 118. This pattern of the clock region 114-31 can be replicated as the clock regions 114-32, 114-33, 114-34 to extend the columns of various programmable logic elements through the programmable logic region 102.

The processing system 104 may be or include any of a variety of different processor types and number of processor cores. For example, the processing system 104 may be implemented as an individual processor, e.g., a single core capable of executing program instruction code. In another example, the processing system 104 may be implemented as a multi-core processor. The processing system 104 may be implemented using any of a variety of different types of architectures. Example architectures that may be used to implement the processing system 104 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The hard block circuits 106 can be or include memory controllers (such as double data rate (DDR) memory controllers, high bandwidth memory (HBM) memory controllers, or the like), peripheral component interconnect express (PCIe) blocks, Ethernet cores (such as a 100 Gbps (C=100) media address controller (CMAC), a multi-rate MAC (MR-MAC), or the like), forward error correction (FEC) blocks, analog-to-digital converters (ADC), digital-to-analog converters (DAC), and/or any other hardened circuit. The input/output circuits 108 can be implemented as eXtreme performance input/output (XPIO), multi-gigabit transceivers (MGTs), or any other input/output blocks. Any of the hard block circuits 106 and/or input/output circuits 108 can be programmable.

The NoC 110 includes a programmable network and a NoC peripheral interconnect (NPI). The programmable network of the NoC 110 communicatively couples subsystems and any other circuits of the SoC 100 together. The programmable network includes NoC packet switches and interconnect lines connecting the NoC packet switches. Each NoC packet switch performs switching of NoC packets in the programmable network. The programmable network has interface circuits at the edges of the programmable network. The interface circuits include NoC master units (NMUs) and NoC slave units (NSUs). Each NMU is an ingress circuit that connects a master circuit to the programmable network, and each NSU is an egress circuit that connects the programmable network to a slave endpoint circuit. NMUs are communicatively coupled to NSUs via the NoC packet switches and interconnect lines of the programmable network. The NoC packet switches are connected to each other and to the NMUs and NSUs through the interconnect lines to implement a plurality of channels in the programmable network. The NoC packet switches, NMUs, and NSUs include register blocks that determine the operation of the respective NoC packet switch, NMU, or NSU. The NPI includes circuitry to write to register blocks that determine the functionality of the NMUs, NSUs, and NoC packet switches. The NPI includes a peripheral interconnect coupled to the register blocks for programming thereof to set functionality. The processing system 104 (e.g., a platform management controller (PMC)) can write to the register blocks of the NMUs, NSUs, and NoC packet switches via the NPI to program the programmable network of the NoC 110. The NPI may be used to program any programmable boundary circuit of the SoC 100. For example, the NPI may be used to program any hard block circuits 106 and/or input/output circuits 108 that is programmable.

The programmable logic region 102 has an associated configuration interconnect 112. The processing system 104 (e.g., PMC) is connected to the configuration interconnect 112. The processing system 104 (e.g., PMC) can send configuration data through the configuration interconnect 112 (e.g., as frames) to the programmable elements of the programmable logic region 102. The configuration data may then be loaded into internal configuration memory cells of the programmable elements that define how the programmable elements are configured and operate.

Various subsystems and circuits of the SoC 100 are communicatively coupled by various communication mechanisms. Some subsystems or circuits can be directly connected to others. For example, the input/output circuits 108 can be directly connected to the hard block circuits 106 and programmable logic region 102, and the hard block circuits 106 can further be directly connected to the programmable logic region 102 and the processing system 104. The programmable logic region 102 can be directly connected to the processing system 104. The programmable logic region 102, processing system 104, hard block circuits 106, and input/output circuits 108 can be communicatively coupled together via the programmable network of the NoC 110.

In some examples, the SoC 100 can be communicatively coupled to other components. For example, the SoC 100 can be communicatively coupled to flash memory and/or RAM (e.g., DDR dynamic RAM (DDRDRAM)) that are separate chips located, e.g., on a same board (e.g., evaluation board) as the SoC 100. The flash memory and the RAM can be communicatively coupled to the input/output circuits 108, for example.

Figure 3:
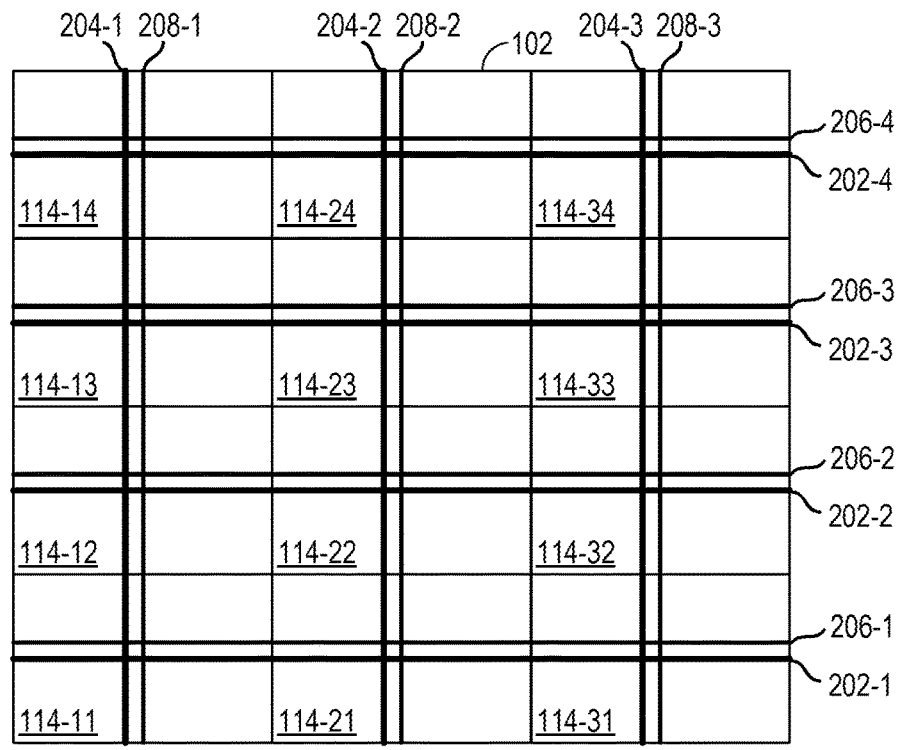
FIG. 3 depicts aspects of a clock routing-layer and a clock distribution-layer in the programmable logic region according to some examples.

FIG. 3 illustrates aspects of a clock routing-layer and a clock distribution-layer in the programmable logic region 102 according to some examples. The clock routing-layer includes horizontal routing-layer tracks 202-1, 202-2, 202-3 (collectively or individually, horizontal routing-layer track(s) 202) and vertical routing-layer tracks 204-1, 204-2, 204-3 (collectively or individually, vertical routing-layer track(s) 204). The clock distribution-layer includes horizontal distribution-layer tracks 206-1, 206-2, 206-3 (collectively or individually, horizontal distribution-layer track(s) 206) and vertical distribution-layer tracks 208-1, 208-2, 208-3 (collectively or individually, vertical distribution-layer track(s) 208). The routing-layer tracks 202, 204 are capable of routing clock signals from one or more global clock buffers to respective central points in one or more clock regions 114 where the routing-layer tracks 202, 204 are connected to the distribution-layer tracks 206, 208 and loads, as described below. Each of the horizontal routing-layer tracks 202, vertical routing-layer tracks 204, horizontal distribution-layer tracks 206, and vertical distribution-layer tracks 208 can be or include twenty-four individual tracks, or another number of tracks, that extend across the programmable logic region 102.

Each of the horizontal routing-layer tracks 202 extends horizontally across the programmable logic region 102 at centers of respective rows of clock regions 114. Horizontal routing-layer tracks 202-1 extend across the programmable logic region 102 at centers of clock regions 114-11, 114-21, 114-31. Horizontal routing-layer tracks 202-2 extend across the programmable logic region 102 at centers of clock regions 114-12, 114-22, 114-32. Horizontal routing-layer tracks 202-3 extend across the programmable logic region 102 at centers of clock regions 114-13, 114-23, 114-33. Horizontal routing-layer tracks 202-4 extend across the programmable logic region 102 at centers of clock regions 114-14, 114-24, 114-34.

Each of the vertical routing-layer tracks 204 extends vertically across the programmable logic region 102 at centers of respective columns of clock regions 114. Vertical routing-layer tracks 204-1 extend across the programmable logic region 102 at centers of clock regions 114-11, 114-12, 114-13, 114-14. Vertical routing-layer tracks 204-2 extend across the programmable logic region 102 at centers of clock regions 114-21, 114-22, 114-23, 114-24. Vertical routing-layer tracks 204-3 extend across the programmable logic region 102 at centers of clock regions 114-31, 114-32, 114-33, 114-34.

Each of the horizontal distribution-layer tracks 206 extends horizontally across the programmable logic region 102 at centers of respective rows of clock regions 114. Horizontal distribution-layer tracks 206-1 extend across the programmable logic region 102 at centers of clock regions 114-11, 114-21, 114-31. Horizontal distribution-layer tracks 206-2 extend across the programmable logic region 102 at centers of clock regions 114-12, 114-22, 114-32. Horizontal distribution-layer tracks 206-3 extend across the programmable logic region 102 at centers of clock regions 114-13, 114-23, 114-33. Horizontal distribution-layer tracks 206-4 extend across the programmable logic region 102 at centers of clock regions 114-14, 114-24, 114-34.

Each of the vertical distribution-layer tracks 208 extends vertically across the programmable logic region 102 at centers of respective columns of clock regions 114. Vertical distribution-layer tracks 208-1 extend across the programmable logic region 102 at centers of clock regions 114-11, 114-12, 114-13, 114-14. Vertical distribution-layer tracks 208-2 extend across the programmable logic region 102 at centers of clock regions 114-21, 114-22, 114-23, 114-24. Vertical distribution-layer tracks 208-3 extend across the programmable logic region 102 at centers of clock regions 114-31, 114-32, 114-33, 114-34.

Figure 4:
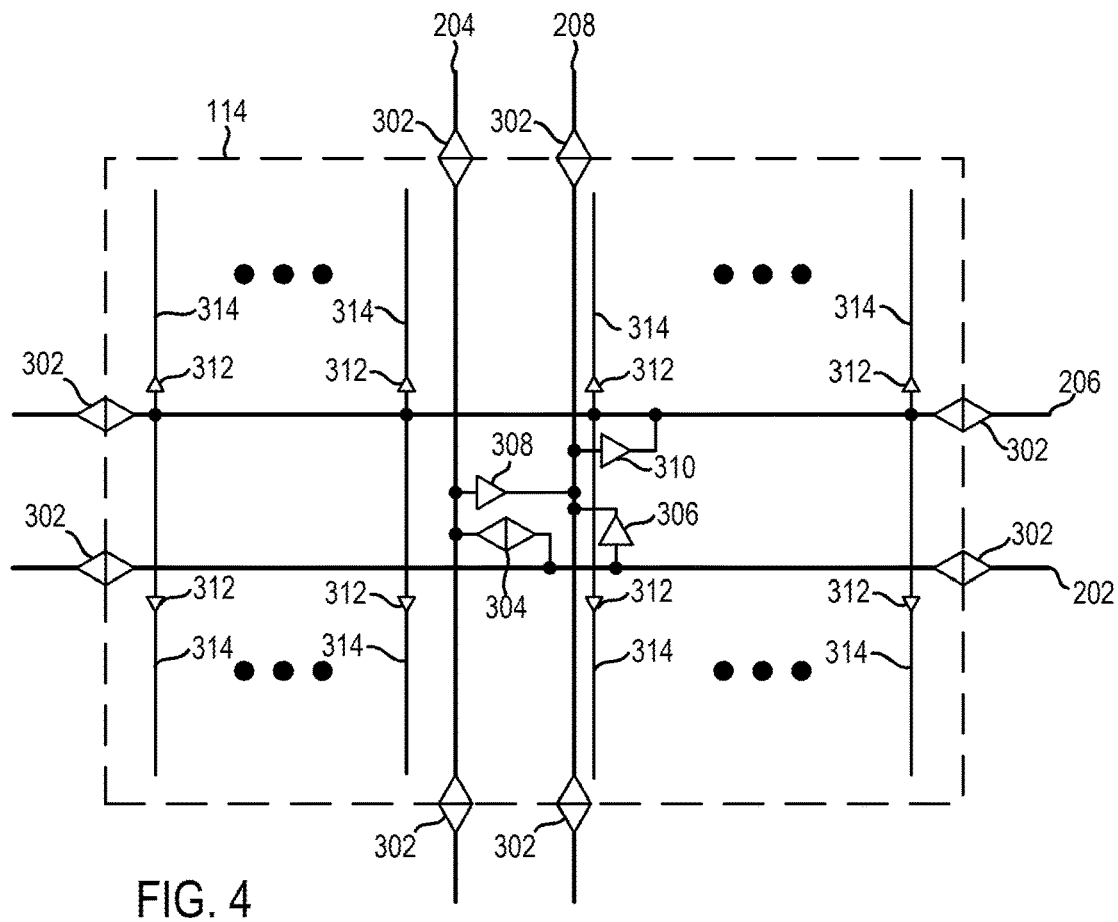
FIG. 4 depicts aspects of a clock routing-layer and a clock distribution-layer in a clock region according to some examples.

FIG. 4 illustrates aspects of a clock routing-layer and a clock distribution-layer in a clock region 114 according to some examples. Bidirectional buffers 302 are at the boundary of the clock region 114 and connect various routing-layer tracks 202, 204 and distribution-layer tracks 206, 208 across neighboring clock regions 114. The bidirectional buffers 302 can connect adjacent respective routing-layer tracks 202, 204 and distribution-layer tracks 206, 208 or disconnect or isolate adjacent respective routing-layer tracks 202, 204 and distribution-layer tracks 206, 208 at the border of the clock region 114.

A bidirectional interconnect buffer 304 is connected between the horizontal routing-layer track 202 and the vertical routing-layer track 204. A unidirectional interconnect buffer 306 has an input node connected to the horizontal routing-layer track 202 and an output node connected to the vertical distribution-layer track 208. A unidirectional interconnect buffer 308 has an input node connected to the vertical routing-layer track 204 and an output node connected to the vertical distribution-layer track 208. A unidirectional interconnect buffer 310 has an input node connected to the vertical distribution-layer track 208 and an output node connected to the horizontal distribution-layer track 206. Input nodes of leaf clock buffers 312 are connected to the horizontal distribution-layer track 206, and respective output nodes of the leaf clock buffers 312 are connected to leaf clock tracks 314 that extend along respective columns in the clock region 114 to programmable logic elements (e.g., loads) within the clock region 114.

A clock signal can be routed from a clock source in a clock region 114 to one or more other clock regions 114 that contain a load. At the clock source, the clock signal can go onto routing-layer tracks 202, 204 that take the clock signal to a central point in a clock region 114 for a root node. The root node may be at a vertical distribution-layer track 208 in the clock region 114, and the routing-layer tracks 202, 204 can be electrically connected to the vertical distribution-layer track 208 that forms the root node in the clock region 114 via the unidirectional interconnect buffer 308. From the root node (e.g., the vertical distribution-layer track 208), the clock signal can then drive the vertical distribution-layer track 208 and various horizontal distribution-layer tracks 206 unidirectionally in each clock region 114 that contains a load. The vertical distribution-layer track 208 forms a vertical trunk. From various horizontal distribution-layer tracks 208 the clock signal can fan out as branches in the respective clock region 114 through the leaf clock buffers 312 and leaf clock tracks 314. The leaf clock buffers 312 can drive a specific point in the respective clock region 114.

Both routing-layer tracks 202, 204 and distribution-layer tracks 206, 208 can drive into horizontally or vertically adjacent clock regions 114 in a segmented fashion. Routing-layer tracks 202, 204 can drive respective routing-layer tracks 202, 204, via respective bidirectional buffers 302, in the adjacent clock regions 114, while the distribution-layer tracks 206, 208 can drive respective distribution-layer tracks 206, 208, via respective bidirectional buffers 302, in the adjacent clock regions 114.

In some examples, a clock source in a clock region 114 can direct a clock signal onto the distribution-layer tracks 206, 208 in a clock region 114 to distribute the clock signal in that clock region 114 or one or more adjacent clock regions 114.

Each buffer 302, 304, 306, 308, 310, 312 may be or include a tri-state buffer. Respective control signals of the buffers 302, 304, 306, 308, 310, 312 can be stored in configuration memory in the programmable logic region 102, which can be programmed during programming the programmable logic region 102. By programming various ones of the buffers 302, 304, 306, 308, 310, 312, clock signals can be routed and distributed from a clock source to various loads in the programmable logic region 102.

Various examples described herein relate to generating clock trees via the routing-layer tracks 202, 204 and distribution-layer tracks 206, 208 for a user design. In some examples, a clock tree includes a distribution-layer vertical trunk tree (e.g., in distribution-layer tracks 206, 208) connecting the clock regions 114 that contain a load, and a routing-layer route (e.g., routing-layer tracks 202, 204) connecting a clock source to the distribution-layer vertical trunk tree. For example, the distribution-layer vertical trunk tree includes a single vertical distribution-layer track 208 as the vertical trunk and one or more horizontal distribution-layer tracks 206 connected to the single vertical distribution-layer track 208.

Figure 5:
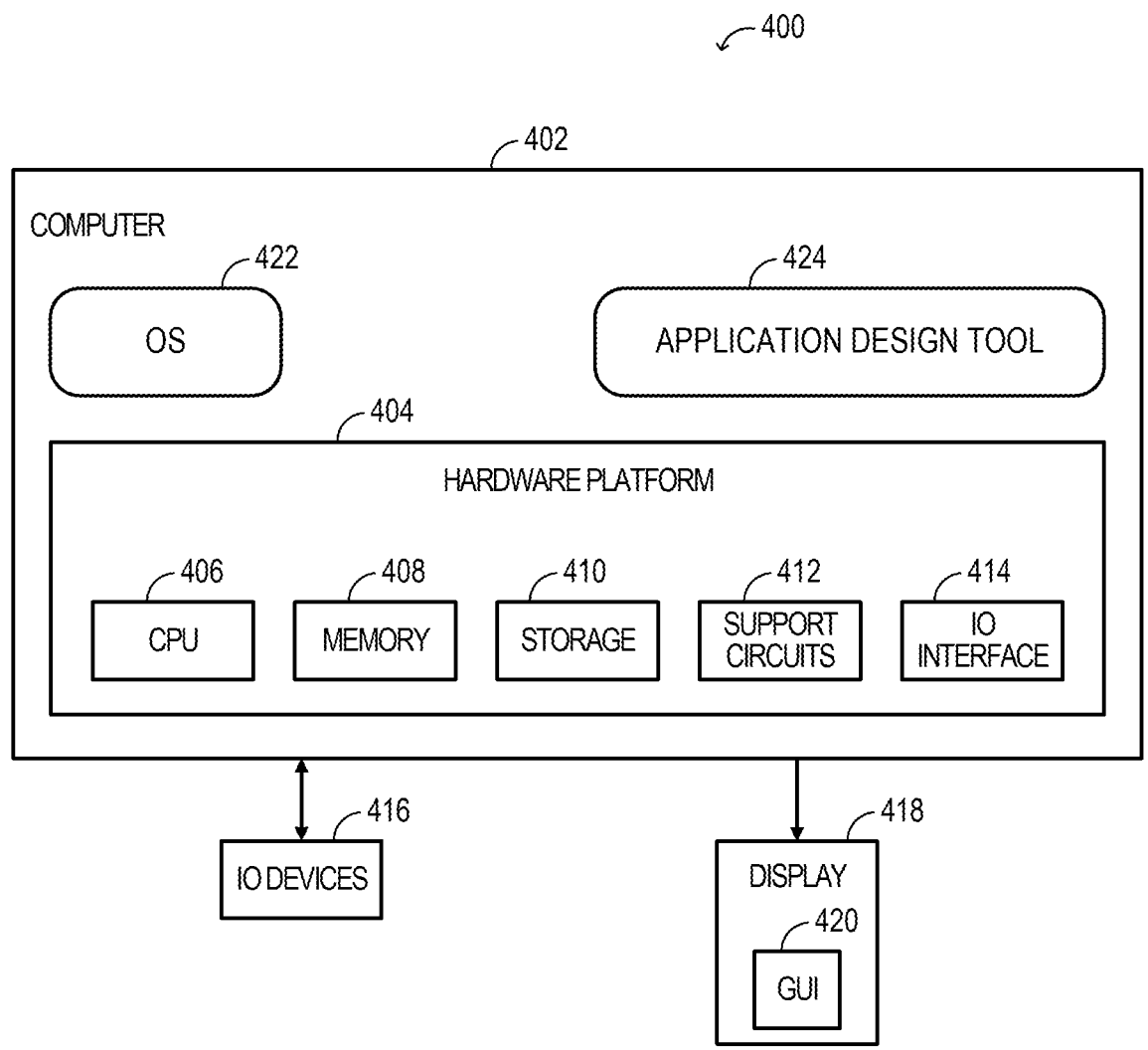
FIG. 5 is a block diagram depicting an example of an application design system according to some examples.

FIG. 5 is a block diagram depicting an example of an application design system 400 according to some examples. The application design system 400 (e.g., a processor-based system) can be used by a user to create an application that can be generated into, e.g., a bit stream that can be loaded on the programmable logic region 102 of the SoC 100 of FIG. 1, for example. The application design system 400 includes a computer 402 coupled to input/output (IO) devices 416 and a display 418. The computer 402 includes a hardware platform 404 that can include components of a computing device, such as a central processing unit (CPU) 406, system memory 408, storage 410, various support circuits 412, and an IO interface 414. The CPU 406 can include one or more microprocessors. The CPU 406 is configured to execute program instruction code that performs one or more operations described herein. The program instruction code can be stored in system memory 408, storage 410, or any other memory in the hardware platform 404 (e.g., cache memory). The system memory 408 includes one or more non-transitory storage mediums that store information and can include, for example, random access memory (RAM), read-only memory (ROM), or a combination thereof. The storage 410 includes one or more local non-transitory storage mediums, such as hard disks, flash memory modules, solid state disks, optical disks, and the like. The storage 410 can also include interface(s) configured for communication with one or more network data storage systems. The support circuits 412 can include cache, power supplies, clock circuits, data registers, IO interfaces, and the like. The IO interface 414 includes interfaces to/from the computer 402. The IO interface 414 can be coupled to the IO devices 416, which can include a keyboard, mouse, and the like. The IO interface 414 can also be coupled to the display 418, which can present a graphical user interface (GUI) 420 to a user.

The computer 402 further includes a software platform comprising an operating system (OS) 422 and an application design tool 424. The OS 422 and the application design tool 424 include program instruction code that is executed by the CPU 406, which program instruction code can be stored in system memory 408, storage 410, or any other memory. The OS 422 can include any known operating system, such as Linux®, Microsoft Windows®, Mac OS®, and the like. The application design tool 424 is an application that executes within the OS 422, which provides an interface to the hardware platform 404. An example application design tool that can be adapted to include the techniques described herein is the Vivado® Design Suite available from Xilinx, Inc. of San Jose, Calif., although other application design tools can be similarly adapted. Some operation of the application design tool 424 is described below.

Figure 6:
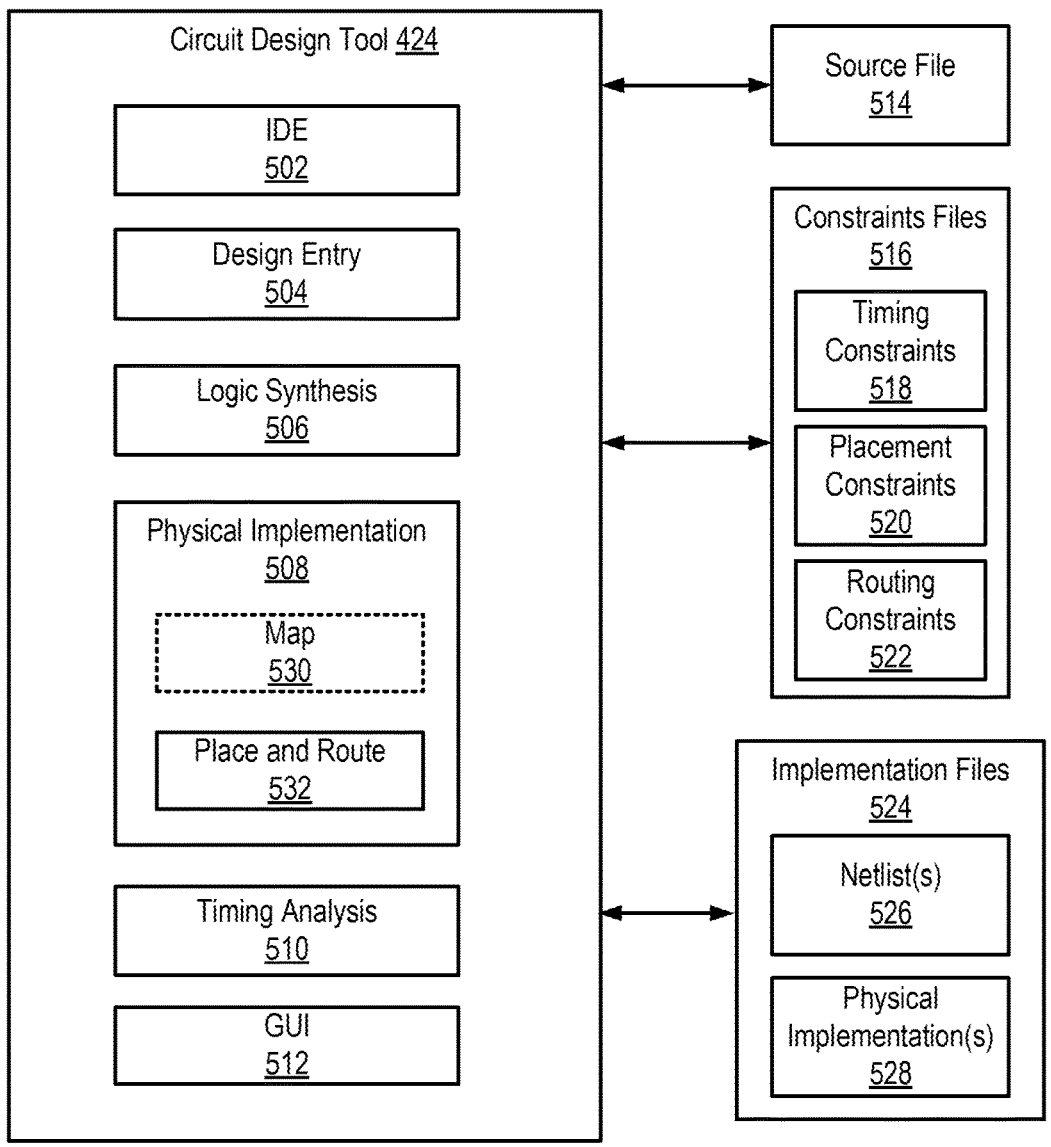
FIG. 6 is a block diagram showing an example of an application design tool according to some examples.

FIG. 6 is a block diagram showing an example of the application design tool 424 according to some examples. The application design tool 424 includes an integrated development environment (IDE) module 502, a design entry module 504, a logic synthesis module 506, a physical implementation module 508, a timing analysis module 510, and a graphical user interface (GUI) module 512. The modules 502-512 are just one example implementation of the application design tool 424. The functions performed by the modules 502-512 described herein can be performed by a different configuration of one or more modules in the application design tool 424. The modules in the application design tool 424 can be implemented by circuitry that is part of the application design system 400, by firmware and/or software in the application design system 400, or by a combination thereof.

In general, the application design tool 424 generates an abstract description of an application (e.g., a circuit design), which is processed into a physical description of the application for implementation in a target programmable logic device, such as the SoC 100. The application design tool 424 can process the abstract description of the application through various intermediate transformations to produce the physical implementation of the application. Thus, the application design tool 424 transforms an abstract representation of the application (the abstract description) into a physical representation of the application (the physical description) that can be formatted to binary data (the physical implementation) that can be used to realize physical circuits in the target programmable logic device.

A user can interact with the application design tool 424 to specify a source file 514 and constraints files 516. The source file 514 can be or include a register-transfer level (RTL) source, a higher-level code (e.g., C or C++ language) source, or another source. In general, the source file 514 has little or no dependence on the target programmable logic device. The constraints files 516 include one or more files specifying constraints on the application. As illustrated, the constraints files 516 include timing constraints 518, placement constraints 520, and routing constraints 522.

The application design tool 424 processes the source file 514 and constraints files 516 to generate implementation files 524. The implementation files 524 include one or more files specifying the application with varying dependence of the target programmable logic device. For example, the implementation files 524 can include one or more netlists 526 and one or more physical implementations 528. The netlist(s) 526 can include synthesized netlists, placed netlists, placed and routed netlists, and the like. The physical implementations 528 can include, e.g., configuration bit-streams.

The IDE module 502 provides a user interface through the GUI module 512 to assemble, implement, and validate an application for the target programmable logic device. The IDE module 502 controls the overall application design process, including invocation of the design entry module 504, the logic synthesis module 506, the physical implementation module 508, and the timing analysis module 510.

The design entry module 504 generates a functional description of the application in response to user input through the GUI module 512. The functional description can include descriptions for a plurality of circuit components, such as flip-flops, memories, logic gates, processors, and the like, coupled together by connections (referred to as "nets" or "signals"). The GUI module 512 can include a graphic interface through which an application designer connects symbols and blocks representing various components to produce a schematic of the application, which is converted into the source file 514. The GUI module 512 can include a text interface through which a user writes HDL code and/or a higher-level code (e.g., C or C++ language) to produce the source file 514. The GUI module 512 can employ a combination of schematic and text-based entry.

The logic synthesis module 506 produces a logical description of the application from the function description specified in the source file 514. The logical description includes a logical representation of the application in terms of specific logic elements. For example, the logic synthesis module 506 can perform "technology mapping" that transforms generic circuit elements and/or function description into technology-specific circuit elements. For example, the logical description can include a representation of the application in terms of specific logic elements optimized to the architecture of a programmable logic device. The logical description can be specified by a netlist 526 (e.g., a synthesized netlist).

The physical implementation module 508 produces a physical description of the application from the logical description. The physical description of the application is a physical representation of the application for implementation in the target programmable logic device. In an example, the physical implementation module 508 comprises a place and route module 532. The place and route module 532 is capable of placing instances of circuit components specified in the logical description within a physical layout of the target programmable logic device ("placement"). The place and route module 532 is also capable of routing nets between the instances specified in the logical description using wires in the target programmable logic device. In an example, the target programmable logic device comprises a programmable IC, and the physical implementation module 508 includes a map module 530. The map module 530 is capable of mapping the instances of circuit components specified in the logical description onto specific types of primitive components defined in the architecture of the target programmable IC (e.g., CLBs, RAMs, IOBs, or the like), which are then placed and routed by the place and route module 532. The physical description can be specified by a netlist 526 (e.g., a placed-and-routed netlist). The physical implementation module 508 can generate a physical implementation 528 from the physical description (e.g., a configuration bitstream for a programmable IC).

The timing analysis module 510 is capable of performing a timing analysis of the logical description and/or physical description of the application. The timing analysis module 510 can verify that the logical description and/or the physical description meets the timing constraints 518 specified by the application designer. The timing analysis can include various timing checks to ensure that the application is fully constrained and that the application meets timing requirements (e.g., slack for timing paths) derived in response to the timing constraints 518.

Figure 7:
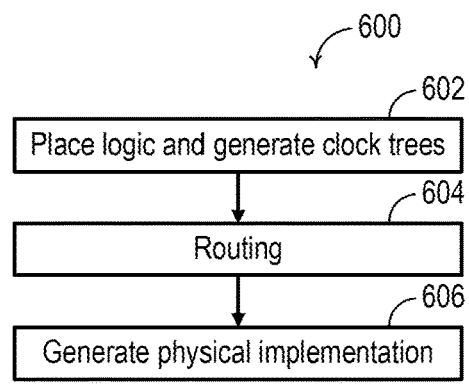
FIG. 7 is a flowchart depicting an example of a method of implementing an application for a programmable logic device according to some examples.

FIG. 7 is a flowchart depicting an example of a method 600 of implementing an application for a programmable logic device according to some examples. The method 600 can be performed by the application design tool 424. At block 602, the place and route module 532 places logic of a logical description of the application and generates clock trees of the application. The placement can place logic functions indicated in a netlist at locations of various cells (e.g., CLBs, RAMs, etc.) in the architecture of the target programmable logic device. The generation of clock trees routes and distributes one or more clock signals from one or more sources to one or more loads. At block 604, the place and route module 532 generates routes between the cells on which a logic function was placed to generate a physical description. During any of the operations of blocks 602 and 604, the timing analysis module 510 can perform a timing analysis to determine whether, e.g., timing constraints are being met. At block 606, the physical implementation module 508 generates a physical implementation (e.g., bitstream) for a target programmable logic device from the physical description.

Figure 8:
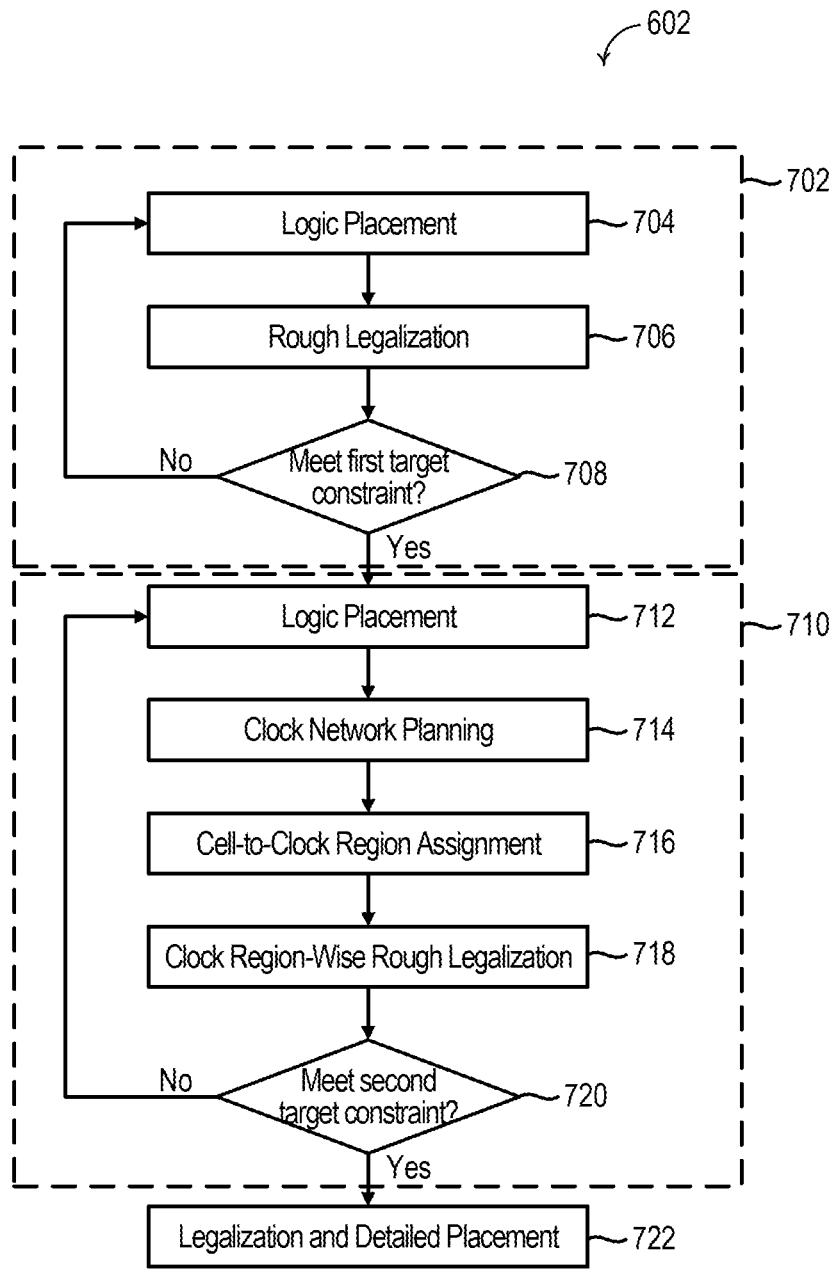
FIG. 8 is a flowchart depicting an example of placing logic and generating clock trees according to some examples.

FIG. 8 is a flowchart depicting an example of placing logic and generating clock trees in block 602 according to some examples. The placing logic and generating clock trees includes a first phase 702. The first phase 702 includes, in block 704, logic placement. The logic placement can use a quadratic programming algorithm to place the logic. The logic placement can be wirelength-driven logic placement and can attempt to minimize wirelength in the global routing network of the programmable logic region 102 between placed logic. The logic placement can adopt the methodology of a SimPL placement algorithm. The first phase 702 also includes a rough legalization in block 706. The rough legalization can eliminate cell overlapping, for example. The first phase 702 further includes a determination of whether a first target constraint is met in block 708. As an example, a first target constraint is whether a lower-bound wirelength and an upper-bound wirelength ratio (LB:UB WL Ratio) is greater than or equal to 0.9 (e.g., LB:UB≥0.9). If the first target constraint is not met in block 708, the first phase 702 loops to blocks 704, and if the first target constraint is met in block 708, the placing logic and generating clock trees proceeds to a second phase 710.

The second phase 710 includes, in block 712, logic placement. The logic placement can use a quadratic programming algorithm to place the logic. The logic placement can be clock-driven logic placement and can attempt to obtain a feasible clock routing solution for the placed logic. The second phase 710 then includes, in block 714, clock network planning. Clock network planning seeks to construct a legal clock routing solution with little perturbation of the previously placed logic from the first phase 702 and/or block 712. Additional details of the clock network planning are described below. In block 716 in the second phase 710, cells are assigned to respective clock regions induced from the resulting clock routing solution. In block 718 of the second phase 710, rough legalization is conducted within each clock region to preserve the clock legality. In block 720, a determination is made whether a second constraint is met. As an example, a second target constraint is whether a lower-bound wirelength and an upper-bound wirelength ratio (LB:UB WL Ratio) is greater than or equal to 0.95 (e.g., LB:UB 0.95). If the second target constraint is not met in block 720, the second phase 710 loops to blocks 712, and if the second target constraint is met in block 720, the placing logic and generating clock trees proceeds to legalization and detailed placement in block 722. The legalization and detailed placement can be performed to further improve the placement result, while honoring the previously achieved clock routing.

An example of the clock network planning in block 714 is based on a branch-and-bound algorithm and has Lagrangian relaxation. This example is described below. Notation of the below example is described in Table 1 for convenience.

TABLE 1

| | | | |
|---|---|---|---|
| v | A cell in the programmable logic region. | n | A temporary variable relating to a counter for obtaining a legal solution. |
| V | The set of cells. $v \in V$ | N | A predefined maximum number of legal solutions to be considered. |
| s | A resource type (e.g., LUT, FF, DSP, RAM) for a cell. | i | A temporary variable relating to a loop counter. |
| § | The set of resource types (e.g., LUT, FF, DSP, RAM) for a cell. $s \in §$ | t | A distribution-layer clock tree candidate. |
| $V^{(s)}$ | The set of cells of resource type $s \in §$. | t* | A temporary variable corresponding to some specified distribution-layer clock tree candidate t. |
| $A_v^{(s)}$ | The demand of cell v for resource type $s \in §$. | T | A set of distribution-layer clock tree candidates. $t \in T$. |
| r | A clock region. | T(e) | A set of distribution-layer clock tree candidates for clock net e; $T = U_{e \in \varepsilon} T(e)$. |
| r* | A temporary variable corresponding to some specified clock region r. | T(r) | A set of distribution-layer clock tree candidates incident on clock region r; $T = U_{r \in R} T(r)$. |
| R | A set of clock regions. $r \in R$ | $H_{t,r}$ | A binary variable indicating whether a given clock tree candidate t occupies a horizontal distribution-layer track in a given clock region r. |
| $C_r^{(s)}$ | The capacity of clock region r for resource type $s \in §$. | $V_{t,r}$ | A binary variable indicating whether a given clock tree candidate t occupies a vertical distribution-layer track in a given clock region r. |
| $D_{v,r}$ | The physical distance between cell v and clock region r. | $U_H(r)$ | Horizontal distribution-layer track utilization in a given clock region r; $U_H(r) = \Sigma_{t \in T} H_{t,r} \cdot z_t$. |
| e | A clock net. | $U_V(r)$ | Vertical distribution-layer track utilization in a given clock region r; $U_V(r) = \Sigma_{t \in T} V_{t,r} \cdot z_t$. |
| $\varepsilon$ | A set of clock nets. $e \in \varepsilon$. | $P_H$ | Number of physical horizontal distribution-layer tracks (e.g., 24) across each row of clock regions. |
| $\varepsilon(v)$ | A set of clock nets incident on cell v. | $P_V$ | Number of physical vertical distribution-layer tracks (e.g., 24) across each column of clock regions. |
| $\kappa_{e,r}$ | A binary variable constraint and indicates if a cell in clock net e can be assigned in clock region r. For example, when a cell in clock net e cannot be assigned in a clock region r, $\kappa_{e,r} = 0$. | $O_H(r)$ | Horizontal distribution-layer track overflow in a given clock region r. $O_H(r) = 0$ if $U_H(r) \leq P_H$; or $O_H(r) = U_H(r) - P_H$ if $U_H(r) > P_H$. |
| $\kappa$ | A set of constraints. $\kappa_{e,r} \in \kappa$. | $O_V(r)$ | Vertical distribution-layer track overflow in a given clock region r. $O_V(r) = 0$ if $U_V(r) \leq P_V$; or $O_V(r) = U_V(r) - P_V$ if $U_V(r) > P_V$. |
| $\kappa^{(i)}$ | A variable having vectors, where each vector includes a set K of constraints. A specified set $\kappa$ of constraints is indicated by index i. | $\phi_t$ | A topology cost of clock tree candidate t. |
| $\kappa^*$ | A derived set of constraints, such as derived from a set $\kappa$ of constraints. | $z_t$ | A binary clock tree candidate selection variable. Indicates whether a clock tree candidate t is selected in a routing solution $\gamma$. If the clock tree candidate t is selected, $z_t = 1$; otherwise, $z_t = 0$. $z_t \in \{0,1\}, \forall t \in T$. |
| K* | A superset of one or more derived sets of constrains, $\kappa^* \in K^*$ | z | A set of clock tree candidate selections. $z_t \in Z$. |
| $x_{v,r}$ | A binary clock region assignment variable. If cell v is assigned to clock region r, then $x_{v,r} = 1$; otherwise, $x_{v,r} = 0$. $x_{v,r} \in \{0,1\}, \forall v \in V, \forall r \in R$. | $z^{(i)}$ | A variable having vectors, where each vector includes a set z of clock tree candidate selections. A specified set z of clock tree candidate selections is indicated by index i. |

TABLE 1-continued

| | | | |
|---|---|---|---|
| x | A set of cell-to-clock region assignments. $x_{v,r} \in x$ | $\lambda_t$ | A Lagrangian variable corresponding to a given clock tree candidate t. |
| $x^{(\kappa)}$ | A set of cell-to-clock region assignments given the set $\kappa$ of constraints | $\lambda$ | A set of Lagrangian variables. $\lambda_t \in \lambda$. |
| x* | A temporary variable relating to a set of cell-to-clock region assignments. | $\lambda^{(i)}$ | A variable having vectors, where each vector includes a set $\lambda$ of Lagrangian variables. A specified set $\lambda$ of Lagrangian variables is indicated by index i. |
| $\gamma$ | A clock routing solution. | $\Delta\lambda_t$ | A base penalty corresponding to a given clock tree candidate t. |
| $\gamma^{(\kappa)}$ | A clock routing solution given the set $\kappa$ of constraints. | $\alpha$ | A scaling factor. |
| $\gamma^*$ | A temporary variable relating to a clock routing solution. | $\delta$ | A tie-breaking variable. |
| $\text{cost}^{(\kappa)}$ | A cost of a clock route having cell-to-clock region assignment $x^{(\kappa)}$. | L | A predefined maximum number of Lagrangian iterations. |
| $\text{cost}_{LB}^{(\kappa)}$ | A lower-bound cost of a clock route having cell-to-clock region assignment $x^{(\kappa)}$. | b | A blockage of clock regions r |
| cost* | A temporary variable relating to cost of a clock route. | B | A set of blockages. $b \in B$. |

Figure 9:
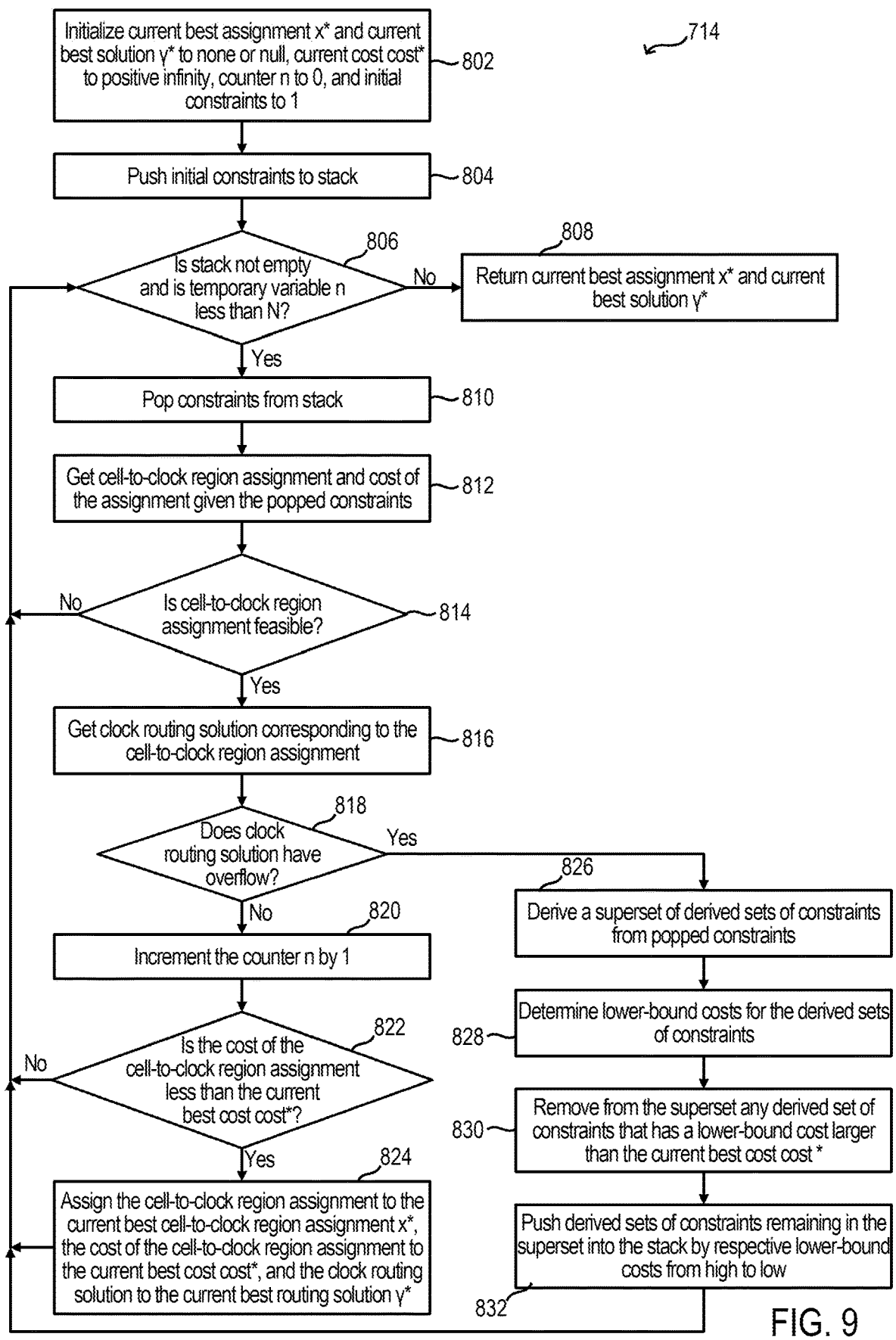
FIG. 9 is a flow chart of a method for clock network planning according to some examples.

FIG. 9 is a flow chart of a method for clock network planning in block 714 according to some examples. In the illustrated example, a tree traversal-based exploration is performed using a stack implemented to search a solution space in a depth-first order (DFS). Generally, the DFS starts based on the initial set $\kappa^{(0)}$ of constraints by being first pushed to the stack, and the DFS is repeated until the stack becomes empty or enough number of feasible solutions are found. During the DFS, various clock-assignment sets $\kappa$ of constraints are branched from the constraint tree rooted at the initial set $\kappa^{(0)}$ of constraints. The best clock tree routing solution found during this DFS exploration can be returned (e.g., to the cell-to-clock region assignment in block 716) as the result.

Input to block 714 includes a logic placement that can include the set V of cells, the set § of resource types, the set $V^{(s)}$ of cells of resource types $s \in §$, the demand $A_v^{(s)}$ of cell v for resource type $s \in §$, the set R of clock regions, the capacity $C_r^{(s)}$ of clock region r for resource type $s \in §$, the physical distance $D_{v,r}$ between cell v and clock region r, and the set ε of clock nets. Additionally, a predefined maximum number N of legal or feasible solutions to be considered is set to some number, such as 10.

In block 802, various variables are initialized. More specifically, a current best cell-to-clock region assignment x* is initialized to none or null; a current best clock routing solution $\gamma^*$ is initialized to none or null; a current best cost cost* is initialized to positive infinity; a counter n is initialized to zero; and a set $\kappa^{(0)}$ of initial constraints is initialized with each constraint $\kappa_{e,r}^{(0)}$ for each clock net e in the set ε of clock nets and for each clock region r in the set R of clock regions being initialized to one (e.g., x*←none; $\gamma^*$←none; cost*←+∞; n←0; and $\kappa_{e,r}^{(0)}$←1, ∀e∈ε, ∀r∈R). Setting the counter n to zero resets the number of feasible solutions to zero. In this example, clock feasibility is not considered initially, and the set $\kappa^{(0)}$ of initial constraints being initialized to one permits any cell-to-clock region assignment subsequently. In block 804, the set $\kappa^{(0)}$ of initial constraints is pushed to a stack.

Block 806 is a condition for a loop. In block 806, a determination is made whether the stack is not empty and the counter n is less than the maximum number N. If not, in block 808, the current best cell-to-clock region assignment x* and current best clock routing solution $\gamma^*$ are returned to the second phase 710 (e.g., to block 716) in FIG. 8. If the determination in block 806 is true or yes, in block 810, a set $\kappa$ of constraints is popped from the stack.

Following block 810, in block 812, a set $x^{(\kappa)}$ of cell-to-clock region assignments and cost $\text{cost}^{(\kappa)}$ of the set $x^{(\kappa)}$ of cell-to-clock region assignments are obtained based on the popped set $\kappa$ of constraints. Generally, the set $x^{(\kappa)}$ of cell-to-clock region assignments reduces movement of a cell-to-clock region assignment that is constrained by logic resources and the popped set $\kappa$ of constraints. The set $x^{(\kappa)}$ of cell-to-clock region assignments can solve a clock-unconstrained version of a branch-and-bound algorithm within the sub-space of a given set $\kappa$ of constraints. A solution for the set $x^{(\kappa)}$ of cell-to-clock region assignments can be written as a binary optimization problem shown in Equation (1) below subject to additional constraints of Equations (2) through (4) below.

$$\min_x \Sigma_{v \in V} \Sigma_{r \in R} D_{v,r} \cdot x_{v,r} \qquad \text{Eq. (1)}$$

$$\Sigma_{r \in R} x_{v,r} = 1, \forall v \in V \qquad \text{Eq. (2)}$$

$$\Sigma_{v \in V} A_v^{(s)} \cdot x_{v,r} \leq C_r^{(s)}, \forall r \in R, \forall s \in § \qquad \text{Eq. (3)}$$

$$x_{v,r} = 0, \forall (v,r) \in \{v \in V, r \in R | \exists e \in \varepsilon(v) s.t. \kappa_{e,r} = 0\} \qquad \text{Eq. (4)}$$

Figure 10:
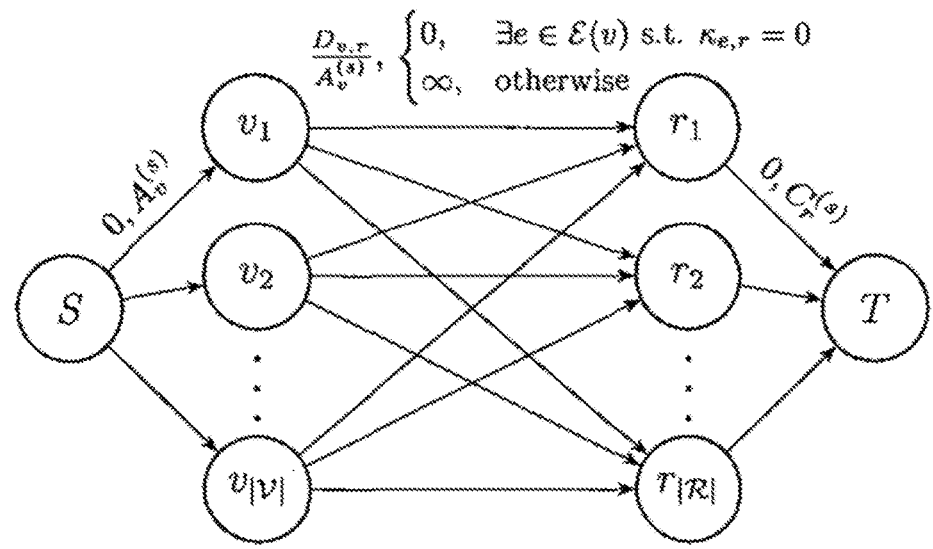
FIG. 10 is a graph representation of a minimum-cost flow with one re-source type according to some examples.

Equation (1) can be approximated by a set of minimum-cost flow problems, each of which corresponds to a resource type (e.g., LUT, FF, DSP, and RAM). Any minimum-cost flow algorithm can be implemented for Equation (1). FIG. 10 is a graph representation of the minimum-cost flow corresponding to Equation (1) with one re-source type. The graph representation is a bipartite graph (regardless of the super source S and the super target T) with vertices for cells ($v_1, v_2, \ldots, v_{|V|}$) on the left and vertices for clock regions ($r_1, r_2, \ldots, r_{|R|}$) on the right. An edge is between each pair of cell and clock region, and the capacity of the edge is set to 0 if the assignment is forbidden by the given constraints $\kappa$ (e.g., $\exists e \in \varepsilon(v) s.t. \kappa_{e,r} = 0$) or, otherwise, to infinity. With the edge cost and capacity settings shown in FIG. 10, computing a minimum-cost flow of amount $\Sigma_{v \in V} A_v^{(s)}$ on the graph can approximate the solution of Equation (1).

Any sub-optimality can be caused by a cell being split and assigned to multiple clock regions in a minimum-cost flow solution. In such a case, fragments of a split cell can be moved to the clock region containing a largest fragment of the split cell to realize an actual cell-to-clock region assignment. In practice, splitting generally occurs in a negligibly small portion of cells, and the global optimality can still be retained. It is worthwhile to mention that, if the logic resource demands of all cells for a given resource types are the same (e.g., $A_i^{(s)} = A_j^{(s)}$, $\forall i, j \in V$), a solution given by the minimum-cost flow can be the optimum of Equation (1). This case may be applicable to resource types that have one single cell type (e.g., DSP or CLB). It is also noted that fragments of split cells being moved to a clock region containing a largest fragment of the split cell can produce some negligible logic resource overflows. If the logic resource constraint should be rigorously honored, slightly tighter logic resource capacities can be applied to leave some margin for the moving of fragments of split cells.

In some instances, a minimum-cost flow solution may not be able to realized as a complete cell-to-clock region assignment (e.g., even without cell splitting). If the resulting flow amount is less than the amount of flow being pushed ($\Sigma_{v \in V} A_v^{(s)}$), then not all the cells can be assigned without logic resource overflow. This can happen in scenarios where clock nets are over-constrained in too-small regions. In such a case, no feasible solutions may exist in the sub-space defined by the given clock-assignment constraints $\kappa$. In such scenarios, such a branch can be pruned as infeasible in a following operation.

In block 814, a determination is made whether the set $x^{(\kappa)}$ of cell-to-clock region assignments is feasible. If not, the set $x^{(\kappa)}$ of cell-to-clock region assignments is discarded, and operation loops back to the condition of block 806. If set $x^{(\kappa)}$ of cell-to-clock region assignments is feasible, in block 816, a clock routing solution $\gamma^{(\kappa)}$ corresponding to the set $x^{(\kappa)}$ of cell-to-clock region assignments is obtained to continue evaluating the clock feasibility of the set $x^{(\kappa)}$ of cell-to-clock region assignments.

As previously described, a clock tree includes a distribution-layer vertical trunk tree (e.g., in distribution-layer tracks 206, 208) that connects to the clock regions that contain clock loads, and a routing-layer route (e.g., routing-layer tracks 202, 204) that connects the distribution-layer vertical trunk tree to the clock source. Since the routing patterns on the distribution and routing layers may be different, the routings on these two layers may be conducted separately. If conducted separately, since routing-layer routing relies on the distribution-layer trunk location, distribution-layer routing is performed first, and routing-layer routing follows.

Figures 11A, 11B, 11C:
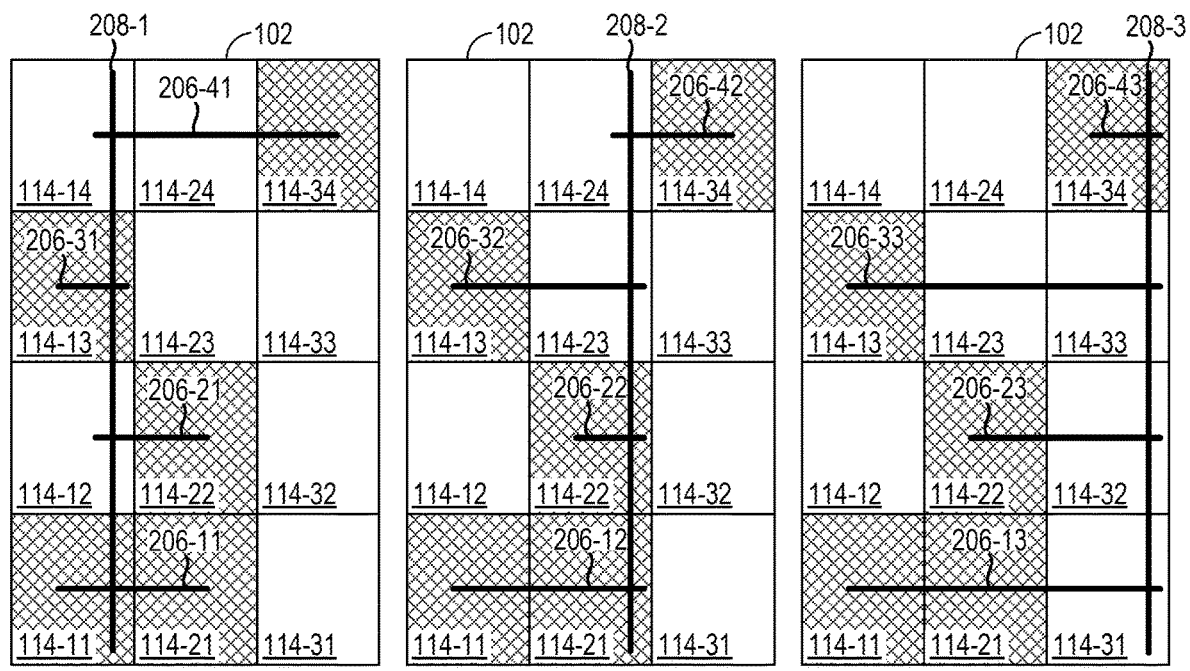
FIGS. 11A, 11B, and 11C depict aspects of generating distribution-layer clock tree candidates according to some examples.

FIGS. 11A, 11B, and 11C illustrate aspects of generating distribution-layer clock tree candidates t according to some examples. FIGS. 11A, 11B, and 11C illustrate the clock regions 114 in the programmable logic region 102. Clock regions 114-11, 114-21, 114-22, 114-13, 114-34 contain a clock load to which a distribution-layer clock tree candidate t is to be connected, and other clock regions 114 do not contain a clock load. Based on the architecture previously described and that a distribution-layer vertical trunk tree is implemented, distribution-layer clock tree candidates t can be generated using a vertical distribution-layer track 208 that extends along each column of clock regions 114 in the programmable logic region 102 as a vertical trunk of a respective distribution-layer clock tree candidate t. With the vertical trunk identified, horizontal distribution-layer tracks 206 connected to the vertical trunk and respective clock regions 114 containing a clock load can naturally be identified. In the illustrated example of FIGS. 11A, 11B, and 11C, the programmable logic region 102 has three columns of clock regions 114, and hence, three clock tree candidates t (e.g., topologies) can be generated for each clock net e. More generally, m-number of clock tree candidates t can be generated for a grid of clock regions 114 having m-number of columns.

In FIG. 11A, vertical distribution-layer track 208-1 is implemented as the vertical trunk, and horizontal distribution-layer tracks 206-11, 206-21, 206-31, 206-41 are connected between the vertical distribution-layer track 208-1 and respective clock regions 114 in a corresponding row that have a clock load. In FIG. 11B, vertical distribution-layer track 208-2 is implemented as the vertical trunk, and horizontal distribution-layer tracks 206-12, 206-22, 206-32, 206-42 are connected between the vertical distribution-layer track 208-2 and respective clock regions 114 in a corresponding row that have a clock load. In FIG. 11C, vertical distribution-layer track 208-3 is implemented as the vertical trunk, and horizontal distribution-layer tracks 206-13, 206-23, 206-33, 206-43 are connected between the vertical distribution-layer track 208-3 and respective clock regions 114 in a corresponding row that have a clock load.

Ideally, one clock tree candidate t is selected from the set T(e) of m clock tree candidates t of clock net e for each clock net e such that there is no vertical distribution-layer overflow and no horizontal distribution-layer overflow. Overflow is when the number of clock nets routed through a vertical distribution-layer or a horizontal distribution-layer in a clock region exceeds the number of physical tracks implemented for the respective vertical distribution-layer or horizontal distribution-layer in the clock region. Also, a topology-dependent objective (e.g., resource usage, clock skew, insertion delay, etc.) may also be optimized.

The distribution-layer clock tree construction can be mathematically written as a binary optimization problem shown in Equation (5) below subject to additional constraints of Equations (6) through (8) below.

$$\min_x \Sigma_{t \in T} \phi_t \cdot z_t \qquad \text{Eq. (5)}$$

$$\Sigma_{t \in T(e)} z_t = 1, \forall e \in \varepsilon \qquad \text{Eq. (6)}$$

$$\Sigma_{t \in T} H_{t,r} \cdot z_t \leq P_H, \forall r \in R \qquad \text{Eq. (7)}$$

$$\Sigma_{t \in T} V_{t,r} \cdot z_t \leq P_V, \forall r \in R \qquad \text{Eq. (8)}$$

Equation (5) is optimized over binary clock tree candidate selections $z_t$ to minimize the objective of topology cost $\phi_t$. If the clock tree candidate t is selected in the routing solution $\gamma^{(\kappa)}$, then $z_t = 1$; otherwise, $z_t = 0$. Equation (6) is a constraint that ensures one clock tree candidate t is selected for each clock net e. Equations (7) and (8) are constraints that bound the horizontal distribution-layer tracks and vertical distribution-layer tracks clock routing usage in each clock region, e.g., to 24 in an example described previously (e.g., $P_H = 24$ and $P_V = 24$). In this example, since feasibility is considered for clock networks, the topology cost $\phi_t$ is set as the total horizontal distribution and vertical distribution demand of the clock tree candidate t. In other examples, other metrics (e.g., clock skew) can also be integrated.

Equation (5) can be solved using integer linear programming algorithms in some examples. In other examples, Equation (5) is relaxed to a simpler problem, as shown in Equation (9) below, which is subject to the constraint of Equation (6) above.

$$\min_x \Sigma_{t \in T} (\phi_t + \lambda_t) \cdot z_t \qquad \text{Eq. (9)}$$

The constraints of Equations (7) and (8) are removed for Equation (9), and a set λ of Lagrangian variables $\lambda_t$ for each clock tree candidate t is added in Equation (9). Each Lagrangian variable $\lambda_t$, can be interpreted as a routing-overflow penalty applied to a respective clock tree candidate t, and a larger value is assigned to the Lagrangian variable $\lambda_t$ if the clock tree candidate t is likely to run through congested regions. By updating these Lagrangian variables $\lambda_t$, and solving Equation (9), overflow-free or overflow-minimized clock routing solutions can be achieved.

Figure 12:
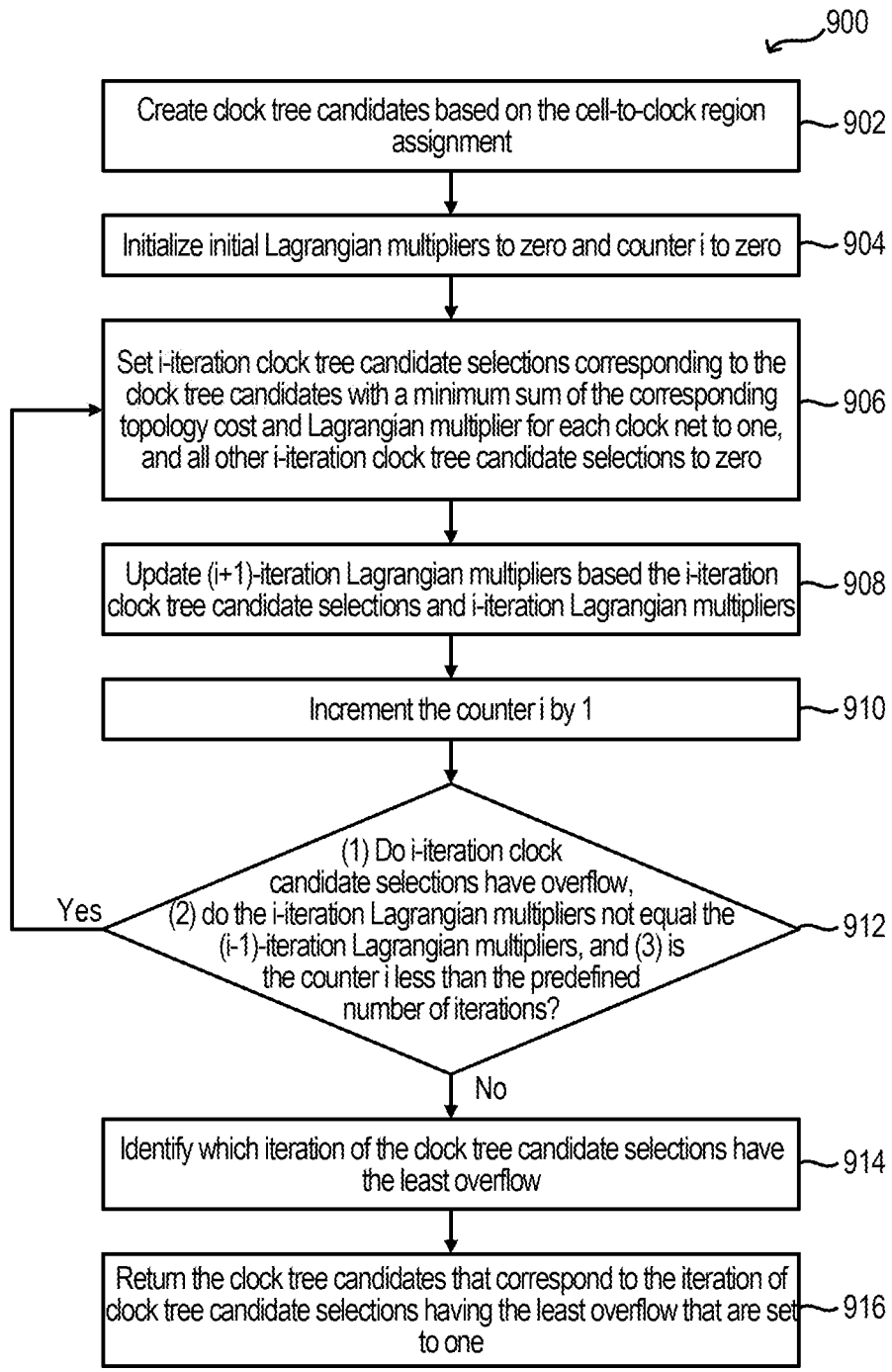
FIG. 12 is a flowchart of a method to generate distribution-layer routing according to some examples.

FIG. 12 is a flowchart of a method 900 to generate distribution-layer routing according to some examples. The method 900 summarizes a Lagrangian relaxation-based distribution-layer clock tree construction. The method 900 may be performed as part of the obtaining a clock routing solution in block 816.

In block 902, clock tree candidates t are created based on the set x of cell-to-clock region assignments, such that the clock tree candidates t form the set T of clock tree candidates. The creation of the clock tree candidates t is like described above with respect to FIGS. 11A-11C.

In block 904, an initial set $\lambda^{(0)}$ of Lagrangian variables $\lambda_t^{(0)}$ and a counter i are initialized to zero (e.g., $\lambda_t^{(0)} \leftarrow 0$, $\forall t \in T$; $i \leftarrow 0$). In block 906, the i-iteration clock tree candidate selections $z_{t^*}^{(i)}$ of the i-iteration set $z^{(i)}$ of clock tree candidate selections that correspond to specified clock tree candidates t* with a minimum sum of the corresponding topology cost $\phi_{t^*}$ and the i-iteration Lagrangian variable $\lambda_{t^*}^{(0)}$ for each clock net e in the set ε of clock nets is set to one, and all other i-iteration clock tree candidate selections $z_t^{(i)}$ of the i-iteration set $z^{(i)}$ of clock tree candidate selections are set to zero. As an example for block 906, each i-iteration clock tree candidate selections $z_t^{(i)}$ of the i-iteration set $z^{(i)}$ of clock tree candidate selections for each clock tree candidate t in the set T of clock tree candidates is set to zero (e.g., $z_t^{(i)} \leftarrow 0$, $\forall t \in T$). Then, for each clock net e in the set ε of clock nets, a specified clock tree candidate t* that has the minimum sum of corresponding topology cost $\phi_{t^*}$ and the i-iteration Lagrangian variable $\lambda_{t^*}^{(i)}$ is identified, and the i-iteration clock tree candidate selection $\lambda_{t^*}^{(i)}$ corresponding to the specified clock tree candidate t* is set to one (e.g., for each e∈ε do {t*←the t∈T with the minimum $(\phi_t+\lambda_t^{(i)})$; $\lambda_{t^*}^{(i)} \leftarrow 1$}). This Lagrangian iteration determines a relaxed solution of Equation (9) based on the given Lagrangian variables.

Figure 13:
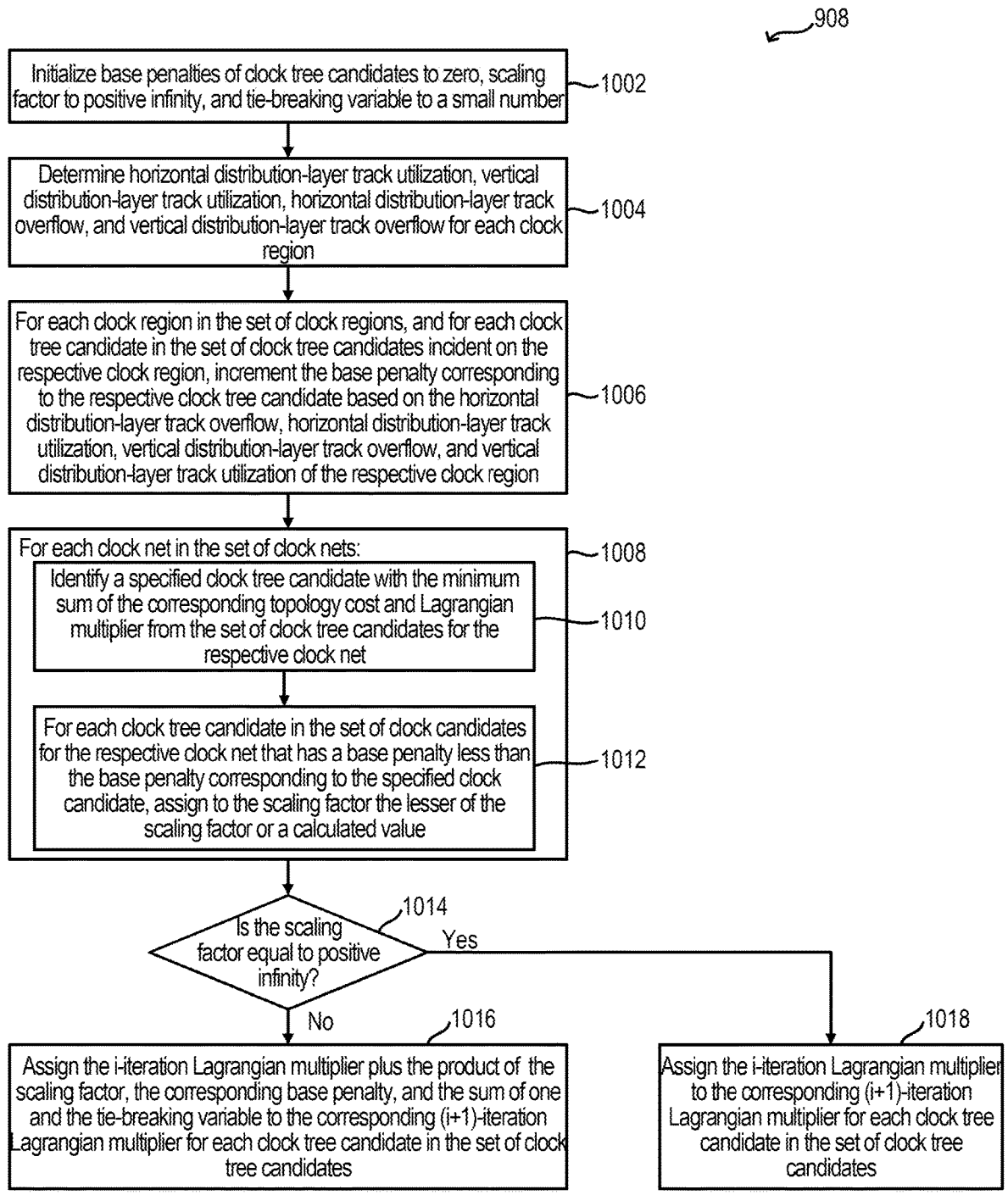
FIG. 13 is an example for updating Lagrangian variables according to some examples.

In block 908, the (i+1)-iteration set $\lambda^{(i+1)}$ of Lagrangian variables is updated based on the i-iteration set $z^{(i)}$ of clock tree candidate selections and the i-iteration set of $\lambda^{(i)}$ Lagrangian variables. FIG. 13 is an example for updating the (i+1)-iteration set $\lambda^{(i+1)}$ of Lagrangian variables in block 908 according to some examples. In block 1002, base penalties $\Delta \lambda_t$ of clock tree candidates t are initialized to zero for clock tree candidates t in the set T of clock tree candidates, a scaling factor α is initialized to positive infinity, and a tie-breaking variable δ is initialized to a small number (e.g., much less than one) (e.g., $\Delta \lambda_t \leftarrow 0$, $\forall t \in T$; $\alpha \leftarrow +\infty$; $\delta \leftarrow 10^{-3}$).

In block 1004, horizontal distribution-layer track utilization $U_H(r)$, vertical distribution-layer track utilization $U_V(r)$, horizontal distribution-layer track overflow $O_H(r)$, and vertical distribution-layer track overflow $O_V(r)$ are determined for each clock region r in the set R of clock regions (e.g., $U_H(r)=\Sigma_{t \in T} H_{t,r} \cdot z_t$, $\forall r \in R$; $U_V(r)=\Sigma_{t \in T} V_{t,r} \cdot z_t$, $\forall r \in R$; $O_H(r)=\{0|(U_H(r) \leq P_H), (U_H(r)-P_H)|(U_H(r)>P_H)\}$, $\forall r \in R$; $O_V(r)=\{0|(U_V(r) \leq P_V), (U_V(r)-P_V)|(U_V(r)>P_V)\}$, $\forall r \in R$).

In block 1006, for each clock region r in the set R of clock regions, and for each clock tree candidate t in the set T(r) of clock tree candidates incident on the respective clock region r, the base penalty $\Delta \lambda_t$ corresponding to the respective clock tree candidate t is incremented based on the horizontal distribution-layer track overflow $O_H(r)$, horizontal distribution-layer track utilization $U_H(r)$, vertical distribution-layer track overflow $O_V(r)$, and vertical distribution-layer track utilization $U_V(r)$ of the respective clock region r. Example pseudocode of block 1006 is as follows:

foreach r∈R do
    foreach t∈T(r) do $$\Delta \lambda_t \leftarrow \Delta \lambda_t + \frac{O_H(r)}{U_H(r)} + \frac{O_V(r)}{U_V(r)};$$

end
end

In this example, the set R of clock regions can be restricted to the clock regions r that have overflow (e.g., $O_H(r)>0$ and/or $O_V(r)>0$). If $O_H(r)=0$ and $O_V(r)=0$, the base penalty $\Delta \lambda_t$ will not be increased in the above pseudocode. Generally, the above pseudocode, for an overflowed clock region r, treats the overflow $O_H(r)$, $O_V(r)$ as a total amount of penalty, and evenly distributes the penalty to all the clock tree candidates t running through the clock region r. Each overflow $O_H(r)$, $O_V(r)$ is normalized by the respective track utilization $U_H(r)$, $U_V(r)$ to evenly distribute the penalty.

In block 1008, blocks 1010 and 1012 are performed for each clock net e in the set ε of clock nets. In block 1010, a specified clock tree candidate t* with a minimum sum of the corresponding topology cost $\phi_{t^*}$ and Lagrangian variable $\lambda_t^*$ is identified from the set T(e) of clock tree candidates for the respective clock net e. In block 1012, for each clock tree candidate t in the set T(e) of clock tree candidates for the respective clock net e that has a base penalty $\Delta \lambda_t$ less than the base penalty $\Delta \lambda_{t^*}$ corresponding to the specified clock tree candidate t*, assign to the scaling factor α the lesser of the scaling factor α or a calculated value. The calculated value is $$\frac{(\phi_t + \lambda_t) - (\phi_{t^*} + \lambda_{t^*})}{\Delta \lambda_{t^*} - \Delta \lambda_t}.$$

Example pseudocode of block 1008 is as follows:
    foreach e∈E do
        t*←the t∈T(e) with the minimum $\phi_t+\lambda_t$;
        foreach t∈T(e) that has $\Delta \lambda_t < \Delta \lambda_t^*$ do $$\alpha \leftarrow \min\left(\alpha, \frac{(\phi_t + \lambda_t) - (\phi_{t^*} + \lambda_{t^*})}{\Delta \lambda_{t^*} - \Delta \lambda_t}\right);$$

end
    end

In block 1014, a determination is made whether the scaling factor α is equal to positive infinity. If the scaling factor α is determined to not be equal to positive infinity in block 1014, in block 1016, the i-iteration Lagrangian variable $\lambda_t^{(i)}$ of the i-iteration set $\lambda^{(i)}$ of Lagrangian variables plus the product of scaling factor α, the corresponding base penalty $\Delta \lambda_t$, and the sum of one and the tie-breaking variable δ is assigned to the corresponding (i+1)-iteration Lagrangian variable $\lambda_t^{(i+1)}$ of the (i+1)-iteration set $\lambda^{(i+1)}$ of Lagrangian variables for each clock tree candidate t in the set T of clock tree candidates (e.g., $\lambda_t^{(i+1)} \leftarrow \lambda_t^{(i)} + \alpha \cdot \Delta \lambda_t \cdot (1+\delta)$, $\forall t \in T$). If scaling factor α is determined to be equal to positive infinity in block 1014, in block 1018, the i-iteration Lagrangian variable $\lambda_t^{(i)}$ of the i-iteration set $\lambda^{(i)}$ of Lagrangian variables is assigned to the corresponding (i+1)-iteration Lagrangian variable $\lambda_t^{(i+1)}$ of the (i+1)-iteration set $\lambda^{(i+1)}$ of Lagrangian variables for each clock tree candidate t in the set T of clock tree candidates (e.g., $\lambda_t^{(i+1)} \leftarrow \lambda_t^{(i)}$, $\forall t \in T$). Generally, the minimum scaling factor α that can change the optimal solution of Equation (9) is calculated. If such a scaling factor α does not exist, Lagrangian variables $\lambda_t$ are kept unchanged. Otherwise, the product of the scaling factor α, the base penalty $\Delta\lambda_t$, and an extra penalty (1+δ) (where δ<<1 is for tie-breaking) are added to the current Lagrangian variable $\lambda_t$, and the result is returned as the next iteration of Lagrangian variables $\lambda_t$. This approach permits (i+1)-iteration Lagrangian variables $\lambda^{(i+1)}$ to be derived from the i-iteration Lagrangian variable $\lambda^{(i)}$ by penalizing clock tree candidates that run through overflowed clock regions in the routing solution given by the i-iteration set $z^{(i)}$ of clock tree candidate selections.

Referring back to FIG. 12, in block 910, the counter i is incremented by one (e.g., i←i+1). In block 912, a determination is made whether (1) (i−1)-iteration set $z^{(i-1)}$ of clock tree candidate selections have overflow, (2) the i-iteration set $\lambda^{(i)}$ of Lagrangian variables are not equal the (i−1)-iteration set $\lambda^{(i-1)}$ of Lagrangian variables, and (3) the counter i is less than the predefined number L of iterations. If the determination in block 912 is true or yes, operation loops back to block 906. If the determination in block 912 is false or no, which iteration j of the 0: (i−1) iterations of the set $z^{(j)}$ of clock tree candidate selections has the least overflow in block 914. The horizontal and vertical distribution-layer track overflows $O_H(r)$, $O_V(r)$ determined in the 0: (i−1) iterations can be used determine which iteration j has the least overflow. In block 916, the clock tree candidates t of the set T of clock tree candidates that correspond to the j-iteration of the set $z^{(j)}$ of clock tree candidates selections that are set to one are returned as the distribution-layer routing (e.g., return $\{t \in T | z_t^{(j)} = 1\}$). Generally, all the explored solutions are back-traced, and the solution with the least routing overflow is returned as the result.

With the distribution-layer routing, the routing-layer routing can be determined. The routing-layer routing is responsible for connecting the clock source to the distribution-layer vertical trunk. Given a distribution-layer clock routing solution, the routing-layer routing can use a 2-pin net global routing problem modified where one of the two pins is a vertical trunk possibly including multiple terminals (e.g., across multiple clock regions 114) rather than a single terminal. An A* search-based routing algorithm can be extended to treat all the clock regions occupied by the distribution-layer vertical trunk as legal endpoints for a given distribution-layer routing. A rip-up and re-route technique can also be applied to iteratively resolve routing overflows in the routing-layer. With the distribution-layer and routing-layer routing, the clock routing solution $\gamma^{(\kappa)}$ is generated.

Referring back to FIG. 9, after the clock routing solution $\gamma^{(\kappa)}$ corresponding to the set $x^{(\kappa)}$ of cell-to-clock region assignments is obtained in block 816, a determination is made whether the clock routing solution $\gamma^{(\kappa)}$ has overflow. If not, in block 820, the counter n is incremented by one, and a determination is made whether the cost $\text{cost}^{(\kappa)}$ of the clock routing solution $\gamma^{(\kappa)}$ is less than the current best cost cost* in block 822. If the determination in block 822 is that the cost $\text{cost}^{(\kappa)}$ is not less than the current best cost cost*, then operation loops back to block 806. If the determination in block 822 is that the cost $\text{cost}^{(\kappa)}$ is less than the current best cost cost*, in block 824, the set $x^{(\kappa)}$ of cell-to-clock region assignments is assigned to the current best cell-to-clock region assignment x*; the cost $\text{cost}^{(\kappa)}$ is assigned to the current best cost cost*; and the clock routing solution $\gamma^{(\kappa)}$ is assigned to the current best clock routing solution γ* (e.g., $x^* \leftarrow x^{(\kappa)}$; $\text{cost}^* \leftarrow \text{cost}^{(\kappa)}$; $\gamma^* \leftarrow \gamma^{(\kappa)}$). When the operation of block 824 is reached, the clock routing solution $\gamma^{(\kappa)}$ is overflow-free, and the set $x^{(\kappa)}$ of cell-to-clock region assignments and the clock routing solution $\gamma^{(\kappa)}$ form a feasible solution, which are updated to the current best solution by assigning them to the current best cell-to-clock region assignment x* and current best clock routing solution γ*, respectively. After block 824, operation loops back to block 806.

If the determination in block 818 is that the clock routing solution $\gamma^{(\kappa)}$ has overflow, in block 826, a superset K* of one or more sets κ* of constraints are derived from the popped set κ of constraints. Generally, when block 826 is reached, an overflow-free clock routing solution could not be found, and new clock-assignment constraints are branched from the popped set κ of constraints to encourage more clock-friendly solutions. These new sets κ* of constraints in the super set K* can be interpreted as subspaces of the popped set κ of constraints, and some previously allowed clock assignments in the popped set κ of constraints can be blocked in the new sets κ* of constraints in the super set K*.

Figure 14:
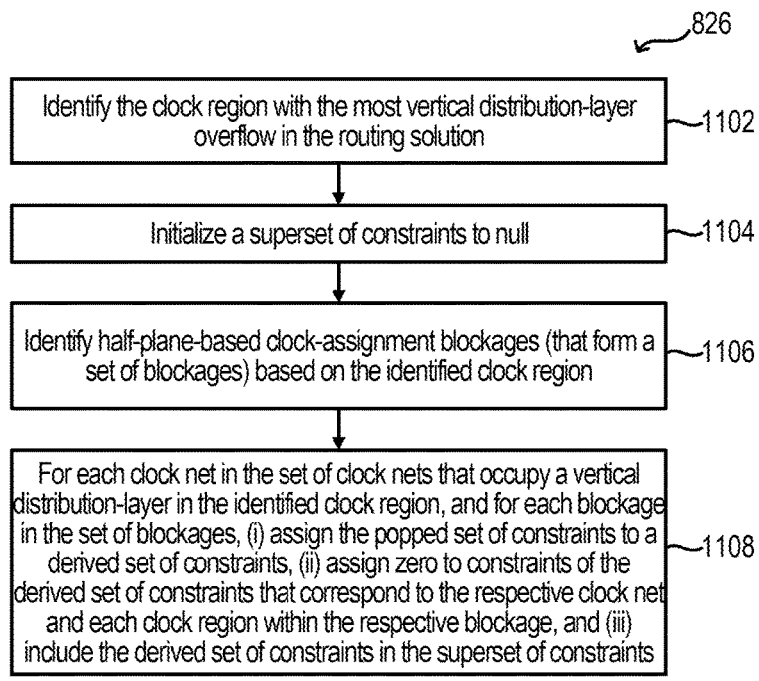
FIG. 14 is a flowchart of an example method for deriving a superset of derived sets of constraints according to some examples.

FIG. 14 is a flowchart of an example method for deriving the superset K* according to some examples. FIG. 14 generalizes a constraint deviation scheme for resolving vertical distribution-layer overflows. In this scheme, for each clock net e that occupies a vertical distribution-layer track in the clock region r with the most vertical distribution-layer overflow, placement blockages b are generated in, e.g., four directions that can potentially alleviate the congestion in the clock region r. Each of these blockages b is imposed on the set κ of constraints to form a derived set K* of new constraints. If there are q clock nets occupying a vertical distribution-layer track in the clock region r, 4q derived sets κ* of constraints will be generated in the superset K*, and each derived set κ* in the superset K* represents a sub-space of the set κ of constraints.

In block 1102, a specified clock region r* having the most vertical distribution-layer overflow in the clock routing solution $\gamma^{(\kappa)}$ is identified. In block 1104, a superset K* is initialized to null (e.g., initially containing no set). In block 1106, half-plane-based clock-assignment blockages b that form a set B of blockages are identified based on the identified clock region r*. Each blockage b is formed as a rectangular region including one or more clock regions 114, where the identified clock region r* is included in the blockage b and has a boundary that forms at least a portion of a boundary of the blockage b.

In the architecture described herein, four blockages b are formed and form the set B of blockages. FIGS. 15A, 15B, 15C, and 15D illustrate example blockages b where the identified clock region r* is clock region 114-22. In such examples, the vertical distribution-layer tracks 208-2 in the clock region 114-22 have the most overflow in the clock routing solution $\gamma^{(\kappa)}$.

Figure 15A:
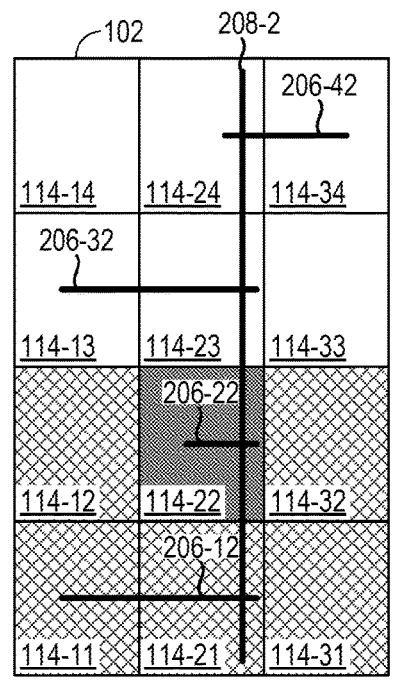
FIGS. 15A, 15B, 15C, and 15D depict example blockages according to some examples.
Figure 15B:
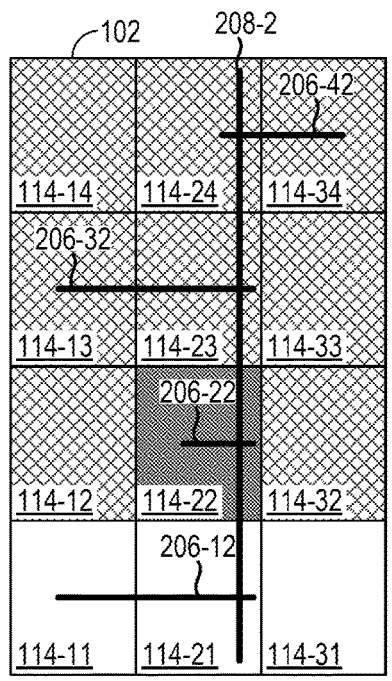
Figure 15C:
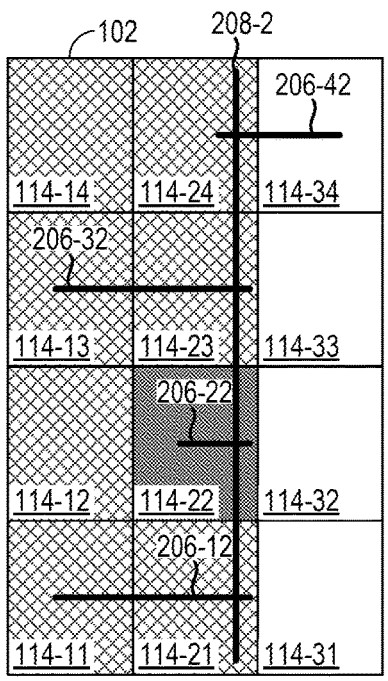
Figure 15D:
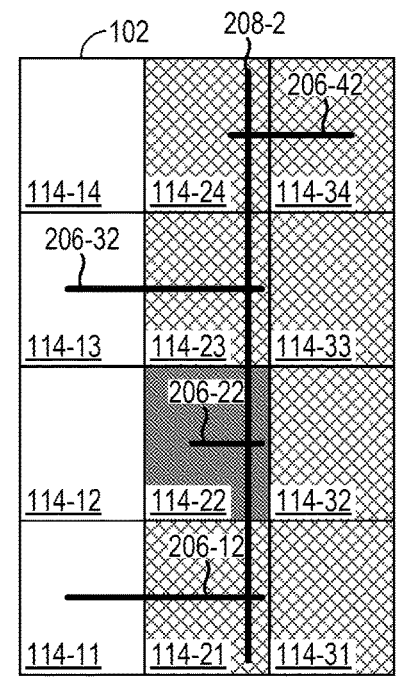

A south blockage b is illustrated in FIG. 15A, where the south blockage b includes clock regions 114-11, 114-12, 114-21, 114-22, 114-31, 114-32. As shown, a top boundary of the clock region 114-22 forms a portion of the top boundary of the south blockage b. A north blockage b is illustrated in FIG. 15B, where the north blockage b includes clock regions 114-12, 114-13, 114-14, 114-22, 114-23, 114-24, 114-32, 114-33, 114-34. As shown, a bottom boundary of the clock region 114-22 forms a portion of the bottom boundary of the north blockage b. A west blockage b is illustrated in FIG. 15C, where the west blockage b includes clock regions 114-11, 114-12, 114-13, 114-14, 114-21, 114-22, 114-23, 114-24. As shown, a right boundary of the clock region 114-22 forms a portion of the right boundary of the west blockage b. An east blockage b is illustrated in FIG. 15D, where the east blockage b includes clock regions 114-21, 114-22, 114-23, 114-24, 114-31, 114-32, 114-33, 114-34. As shown, a left boundary of the clock region 114-22 forms a portion of the left boundary of the east blockage b.

Referring back to FIG. 14, in block 1108, for each clock net e of the set ε of clock nets that occupy a vertical distribution-layer track in the identified clock region r*, and for each blockage b in the set B of blockages, (i) the popped set κ of constraints are assigned to a derived set κ* of constraints, (ii) a zero is assigned to constraints $κ^*_{e,r}$ of the derived set κ* of constraints that correspond to the respective clock net e and each clock region r within the blockage b, and (iii) the derived set κ* of constraints are included in the superset K* of one or more derived sets κ* of constraints. Example pseudocode for block 1108 is below:

foreach e∈ε that occupies a vertical distribution track in r* do
   foreach b∈B do
      κ*←κ;
      $κ^*_{e,r}$←0, ∀r∈b;
      K*←K*∪κ*;
   end
end.

A constraint derivation for horizontal distribution-layer overflow may be similar to that for vertical distribution-layer overflow, as described above. Given the fact that horizontal distribution-layer branches affect the tree topology more locally than vertical distribution-layer trunks, blockages of granularities finer than illustrated in FIGS. 15A-15D might be able to achieve better results. For example, corner-based blockages or row-based blockages can potentially resolve the overflow with less cell movement compared with the blockages shown in FIGS. 15A-15D. Corner-based blockages can be formed by forming rectangular regions including one or more clock regions 114, where the clock region with the most overflow is included in each blockage and at a corner of the respective blockage (e.g., has two boundaries that form at least a portion of respective boundaries of the blockage). Row-based blockages can be formed by forming regions including one or more clock regions 114 along the row in which the clock region with the most overflow is disposed, where the clock region with the most overflow is included in each blockage. A left row blockage includes the clock region with the most overflow and clock regions to the left of that clock region. A right row blockage includes the clock region with the most overflow and clock regions to the right of that clock region. A whole row blockage includes the clock regions in the row in which the clock region with the most overflow is disposed.

Various constraint derivation schemes may be implemented. The framework for clock tree generation is generic, and any other constraint derivation methods can be easily integrated.

The above description for deriving derived sets κ* of constraints, as described, applies to distribution-layer routing. In practice, routing-layer routing may be less congested than distribution-layer routing, and hence, the above description is applied to distribution-layer routing. Concepts described above may also be extended or applicable to routing-layer routing.

Referring back to FIG. 9, in block 828, lower-bound costs $cost_{LB}(κ^*)$ are determined for the derived sets κ* of constraints in the superset K*. The lower-bound cost $cost_{LB}(κ^*)$ can be calculated as shown below by Equation (10).

$$cost_{LB}(κ^*) = \sum_{v \in V} \min_{\{r \in \mathcal{R} | κ^*_{e,r}=1, \forall e \in \varepsilon(v)\}} D_{v,r} \qquad \text{Eq. (10)}$$

In block 830, any derived set κ* of constraints in the superset K* that has a lower-bound cost $cost_{LB}(κ^*)$ that is larger than the current best cost cost* is removed from the superset K* of derived sets κ* of constraints. Removing any derived set κ* of constraints prunes the sets κ* that result in sub-optimal solutions. In block 832, the remaining derived sets κ* of constraints in the superset K* are pushed into the stack by respective lower-bound costs $cost_{LB}(κ^*)$ from high to low. By pushing the remaining derived sets κ* of constraints in this order, a branch with the minimum lower-bound cost $cost_{LB}(κ^*)$ is explored first at each constraint tree node in subsequent iterations. Operation then loops back to block 806.

As will be appreciated by one having ordinary skill in the art, some examples disclosed herein may be embodied as a system, method, or computer program product. Accordingly, aspects may take the form of an entirely hardware embodiment, an entirely software embodiment (including firmware, resident software, micro-code, etc.), or a combination of software and hardware aspects. Furthermore, aspects may take the form of a computer program product embodied in one or more non-transitory computer readable storage medium(s) having computer readable program instruction code embodied thereon. A computer readable storage medium may be or include a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program instruction code for carrying out operations for aspects described herein may be written in any combination of one or more programming languages, including an object oriented programming language such as Java, Smalltalk, C++ or the like and conventional procedural programming languages, such as the C programming language or similar programming languages. The program instruction code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of various examples have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instruction code. These computer program instruction code may be provided to a processor of a general purpose computer, special purpose computer, or other programmable data processing apparatus to produce a machine, such that the program instruction code, which execute via the processor of the computer or other programmable data processing apparatus, create means for implementing the functions/acts specified in the flowchart and/or block diagram block or blocks.

These computer program instruction code may also be stored in a computer readable medium that can direct a computer, other programmable data processing apparatus, or other devices to function in a particular manner, such that the program instruction code stored in the computer readable medium produce an article of manufacture including program instruction code which implement the function/act specified in the flowchart and/or block diagram block or blocks.

The computer program instruction code may also be loaded onto a computer, other programmable data processing apparatus, or other devices to cause a series of operational steps to be performed on the computer, other programmable apparatus or other devices to produce a computer implemented process such that the program instruction code which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various examples. In this regard, each block in the flowchart or block diagrams may represent a module, segment, or portion of program instruction code, which comprises one or more executable program instruction code for implementing the specified logical function(s). In some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer program instruction code.

While the foregoing is directed to specific examples, other and further examples may be devised without departing from the basic scope thereof, and the scope thereof is determined by the claims that follow.

What is claimed is:

1. A design system comprising:
   a processor; and
   a memory coupled to the processor, the memory storing instruction code, the processor being configured to execute the instruction code to:
      generate clock trees simultaneously with placing logic for an application to be implemented in a programmable logic region of a programmable logic device;
      generate data routes between the placed logic; and
      generate a physical implementation of the application based on the placed logic, the clock trees, and the data routes, the physical implementation being capable of being loaded on the programmable logic region of the programmable logic device.

2. The design system of claim 1, wherein the processor being configured to execute the instruction code to generate the clock trees simultaneously with placing the logic is further configured to execute the instruction code to:
   iteratively, until a target constraint is met:
      place the logic;
      generate at least temporary clock trees based on the placed logic;
      assign cells to clock regions based on the placed logic and the at least temporary clock trees; and
      perform a rough legalization of the placed logic and the at least temporary clock trees.

3. The design system of claim 1, wherein the processor being configured to execute the instruction code to generate the clock trees simultaneously with placing the logic is further configured to execute the instruction code to:
   perform a first phase placement of the logic based on wirelength between the logic;
   subsequent to performing the first phase placement, perform a second phase placement of the logic and generating the clock trees, the second phase placement being based on the clock trees; and
   subsequent to performing the second phase placement, perform a detailed placement of the logic.

4. The design system of claim 1, wherein each of the clock trees includes:
   a trunk in a distribution-layer of the programmable logic region;
   a branch in the distribution-layer connected to the trunk; and
   a route in a routing-layer of the programmable logic region, the route connecting a clock source to the trunk.

5. The design system of claim 1, wherein the processor being configured to execute the instruction code to generate the clock trees simultaneously with placing the logic is further configured to execute the instruction code to:
   push initial constraints to a stack;
   iteratively until the stack is empty or until a first predetermined number of iterations is performed:
      pop constraints from the stack;
      obtain a cell-to-clock region assignment based on the popped constraints; and
      if the cell-to-clock region assignment is feasible:
         obtain a clock routing solution based on the cell-to-clock region assignment;
         if the clock routing solution has routing overflow:
            derive one or more derived sets of constraints based on the popped constraints;
            prune a set of the one or more derived sets of constraints based on respective lower-bound costs of the one or more derived sets of constraints; and
            push any remaining set of the one or more derived sets of constraints to the stack; and
         if the clock routing solution does not have routing overflow and a cost of the cell-to-clock region assignment is less than a current best cost:
            assign the cost of the cell-to-clock region assignment to the current best cost;
            assign the clock routing solution to a current best clock routing solution; and
            assign the cell-to-clock region assignment to a current best cell-to-clock region assignment; and
   assign the current best clock routing solution as the clock trees.

6. The design system of claim 5, wherein the processor being configured to execute the instruction code to obtain the clock routing solution is further configured to execute the instruction code to:
- create clock tree candidates based on the cell-to-clock region assignment;
- iteratively until a current iteration set of selection variables has no routing overflow, a current iteration set of Lagrangian variables equals a next iteration set of Lagrangian variables, or a second predetermined number of iterations has been performed:
  - determine the current iteration set of selection variables, each selection variable of the current iteration set of selection variables indicating whether a corresponding one of the clock tree candidates is selected for routing a clock net, the current iteration set of selection variables indicating identified clock tree candidates, each of the identified clock tree candidates, for a respective clock net, having a minimum sum of a corresponding topology cost and a corresponding current iteration Lagrangian variable of the current iteration set of Lagrangian variables; and
  - update the next iteration set of Lagrangian variables based on overflow of the current iteration set of selection variables and the current iteration set of Lagrangian variables; and
- assign clock tree candidates indicated as being selected for routing by an iteration set of selection variables that has a minimum overflow to the clock routing solution.

7. The design system of claim 5, wherein the processor being configured to execute the instruction code to derive the one or more derived sets of constraints based on the popped constraints is further configured to execute the instruction code to:
- identify an overflowed clock region having a most overflow of clock regions of the programmable logic region;
- identify blockages in the programmable logic region, each of the blockages including the overflowed clock region; and
- for each clock net through the overflowed clock region and each of the blockages:
  - assign the popped constraints to a derived set of constraints;
  - for each clock region of the respective blockage, assign a constraint of the derived set of constraints corresponding to the respective clock net and the respective clock region a value indicating that the respective clock net cannot be routed in the respective clock region; and
  - include the derived set of constraints in the one or more derived sets of constraints.

8. A design system comprising:
a processor; and
a memory coupled to the processor, the memory storing instruction code, the processor being configured to execute the instruction code to:
- generate a clock routing solution for clock trees for clock nets of an application to be implemented in a programmable logic region of a programmable logic device, comprising:
  - create clock tree candidates for a cell-to-clock region assignment;
  - iteratively until a current iteration set of selection variables has no overflow, a current iteration set of Lagrangian variables equals a next iteration set of Lagrangian variables, or a first predetermined number of iterations has been performed:
    - for each of the clock nets, identify one of the clock tree candidates having a minimum sum of a corresponding topology cost and a corresponding Lagrangian variable of the current iteration set of Lagrangian variables, for each identified one of the clock tree candidates, an indication being set for one selection variable of the current iteration set of selection variables corresponding to the respective identified one of the clock tree candidates; and
    - update the next iteration set of Lagrangian variables based on the current iteration set of Lagrangian variables and the current iteration set of selection variables; and
  - assign the clock tree candidates corresponding to the respective indications of selection variables of a set of selection variables having a minimum overflow to the clock routing solution.

9. The design system of claim 8, wherein the processor being configured to execute the instruction code to update the next iteration set of Lagrangian variables is further configured to execute the instruction code to:
- initialize base penalties, each of the base penalties corresponding to one of the clock tree candidates;
- determine an overflow for each of clock regions of the programmable logic region based on the current iteration set of selection variables;
- for each of the clock regions, and for each of the clock tree candidates incident on the respective clock region, increase the base penalty corresponding to the respective clock tree candidate an additional penalty amount based on the overflow of the respective clock region;
- determine a scaling factor, the scaling factor having a preset value, determining the scaling factor comprising for each of the clock nets, and for each of the clock tree candidates for the respective clock net that has a corresponding base penalty less than a base penalty corresponding to the identified one of the clock tree candidates having the minimum sum of the corresponding topology cost and the corresponding Lagrangian variable for the respective clock net, assigning to the scaling factor a minimum of (i) the scaling factor and (ii) a calculated value based on the base penalty of the respective clock tree candidate and the base penalty of the identified one of the clock tree candidates for the respective clock net;
- if the scaling factor is equal to the preset value, assign Lagrangian variables of the next iteration set of Lagrangian variables equal to corresponding Lagrangian variables of the current iteration set of Lagrangian variables; and
- if the scaling factor is not equal to the preset value, assign Lagrangian variables of the next iteration set of Lagrangian variables equal to corresponding Lagrangian variables of the current iteration set of Lagrangian variables plus respective amounts based on respective base penalties and the scaling factor.

10. The design system of claim 9, wherein the calculated value is further based on the topology cost and the Lagrangian variable of the current iteration set of Lagrangian variables corresponding to the respective clock tree candidate and the topology cost and the Lagrangian variable of the current iteration set of Lagrangian variables corresponding to the identified one of the clock tree candidates for the respective clock net.

11. The design system of claim 9, wherein the calculated value is:
(1) a difference of (a) a sum of the topology cost and the Lagrangian variable of the current iteration set of Lagrangian variables corresponding to the identified one of the clock tree candidates for the respective clock net, from (b) a sum of the topology cost and the Lagrangian variable of the current iteration set of Lagrangian variables corresponding to the respective clock tree candidate, divided by (2) a difference of (a) the base penalty corresponding to the respective clock tree candidate from (b) the base penalty corresponding to the identified one of the clock tree candidates for the respective clock net.

12. The design system of claim 9, wherein the respective amounts based on respective base penalties and the scaling factor includes a product of the respective base penalty, the scaling factor, and a tie-breaking amount greater than one.

13. The design system of claim 9, wherein the additional penalty amount includes the overflow of the respective clock region normalized based on a utilization of the respective clock region.

14. The design system of claim 8, wherein the processor is configured to execute the instruction code to:
obtain the cell-to-clock region assignment based on a set of constraints; and
derive a superset of derived sets of constraints from the set of constraints.

15. The design system of claim 14, wherein the processor being configured to derive the superset of derived sets of constraints is configured to execute the instruction code to:
identify blockages containing a clock region that has overflow;
for each of the clock nets that is through the clock region that has overflow, and for each of the blockages:
assign the set of constraints to a derived set of constraints;
for each clock region of the respective blockage, assign a constraint of the derived set of constraints corresponding to the respective clock net and the respective clock region a value indicating that the respective clock net cannot be routed in the respective clock region; and
include the derived set of constraints in the superset of derived sets of constraints.

16. A design system comprising:
a processor; and
a memory coupled to the processor, the memory storing instruction code, the processor being configured to execute the instruction code to:
generate clock trees for an application to be implemented in a programmable logic region of a programmable logic device, comprising:
initialize a set of constraints;
push the set of constraints to a stack;
iteratively while the stack is not empty and until a first predefined number of iterations is performed:
pop a popped set of constraints from the stack;
obtain a cell-to-clock region assignment based on the popped set of constraints;
obtain a cost of the cell-to-clock region assignment; and
if the cell-to-clock region assignment is feasible:
obtain a clock routing solution corresponding to the cell-to-clock region assignment;
if the clock routing solution does not have overflow and the cost is less than a current best cost, assign the cost to the current best cost, the cell-to-clock region assignment to a current best cell-to-clock region assignment, and the clock routing solution to a current best clock routing solution; and
if the clock routing solution has overflow:
derive a superset of derived sets of constraints from the popped set of constraints;
prune one or more of the derived sets of constraints from the superset of derived sets of constraints based on respective lower-bound costs of the one or more of the derived sets of constraints; and
push remaining one or more derived sets of constraints of the superset to the stack based on the respective lower-bound costs of the remaining one or more derived sets of constraints; and
assign the current best clock routing solution to the clock trees; and
generate a physical implementation of the application based on placed logic and the clock trees, the physical implementation being capable of being loaded on the programmable logic region of the programmable logic device.

17. The design system of claim 16, wherein the processor being configured to execute the instruction code to obtain the clock routing solution is configured to:
create clock tree candidates for the cell-to-clock region assignment;
iteratively until a current iteration set of selection variables has no overflow, a current iteration set of Lagrangian variables equals a next iteration set of Lagrangian variables, or a second predefined number of iterations has been performed:
for each of clock nets, identify one of the clock tree candidates having a minimum sum of a corresponding topology cost and a corresponding Lagrangian variable of the current iteration set of Lagrangian variables, for each identified one of the clock tree candidates, an indication being set for one selection variable of the current iteration set of selection variables corresponding to the respective identified one of the clock tree candidates; and
update the next iteration set of Lagrangian variables based on the current iteration set of Lagrangian variables and the current iteration set of selection variables; and
assign the clock tree candidates corresponding to the respective indications of selection variables of an iteration set of selection variables having a minimum overflow as the clock routing solution.

18. The design system of claim 17, wherein the processor being configured to execute the instruction code to update the next iteration set of Lagrangian variables is further configured to execute the instruction code to:
initialize base penalties, each of the base penalties corresponding to one of the clock tree candidates;
determine an overflow for each of clock regions of the programmable logic region based on the current iteration set of selection variables;
for each of the clock regions, and for each of the clock tree candidates incident on the respective clock region, increase the base penalty corresponding to the respective clock tree candidate an additional penalty amount based on the overflow of the respective clock region;
determine a scaling factor, the scaling factor having a preset value, determining the scaling factor comprising for each of the clock nets, and for each of the clock tree candidates for the respective clock net that has a corresponding base penalty less than a base penalty corresponding to the identified one of the clock tree candidates having the minimum sum of the corresponding topology cost and the corresponding Lagrangian variable for the respective clock net, assigning to the scaling factor a minimum of (i) the scaling factor and (ii) a calculated value based on the base penalty of the respective clock tree candidate and the base penalty of the identified one of the clock tree candidates for the respective clock net;

if the scaling factor is equal to the preset value, assign Lagrangian variables of the next iteration set of Lagrangian variables equal to corresponding Lagrangian variables of the current iteration set of Lagrangian variables; and if the scaling factor is not equal to the preset value, assign Lagrangian variables of the next iteration set of Lagrangian variables equal to corresponding Lagrangian variables of the current iteration set of Lagrangian variables plus respective amounts based on respective base penalties and the scaling factor.

19. The design system of claim 18, wherein:

the additional penalty amount includes the overflow of the respective clock region normalized based on a utilization of the respective clock region; and the calculated value is further based on the topology cost and the Lagrangian variable of the current iteration set of Lagrangian variables corresponding to the respective clock tree candidate and the topology cost and the Lagrangian variable of the current iteration set of Lagrangian variables corresponding to the identified one of the clock tree candidates for the respective net.

20. The design system of claim 16, wherein the processor being configured to execute the instruction code to derive the superset of derived sets of constraints is configured to:

identify an overflowed clock region having a most overflow of clock regions of the programmable logic region;

identify blockages in the programmable logic region, each of the blockages including the overflowed clock region;

for each clock net that is through the overflowed clock region and for each of the blockages:

assign the popped set of constraints to a derived set of constraints;

for each clock region of the respective blockage, assign a constraint of the derived set of constraints corresponding to the respective clock net and the respective clock region a value indicating that the respective clock net cannot be routed in the respective clock region; and include the derived set of constraints in the superset of derived sets of constraints.

* * * * *

UNITED STATES PATENT AND TRADEMARK OFFICE
CERTIFICATE OF CORRECTION

PATENT NO. : 10,860,765 B1
APPLICATION NO. : 16/283552
DATED : December 8, 2020
INVENTOR(S) : Li et al.

It is certified that error appears in the above-identified patent and that said Letters Patent is hereby corrected as shown below:

In the Specification

Column 19, Line 40, Delete "$\lambda_{t^*}^{(i)}$" and insert -- $z_{t^*}^{(i)}$ --, therefor.

Column 19, Line 42, Delete "$\lambda_{t^*}^{(i)} \leftarrow 1\})$." and insert -- $z_{t^*}^{(i)} \leftarrow 1\})$. --, therefor.

Column 19, Line 61, Delete "$\forall r \in O_H(r)$" and insert -- $\forall r \in R; O_H(r)$ --, therefor.

Column 20, Line 45, Delete "e∈E" and insert --  --, therefor.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*